United States Patent
Kascak et al.

(10) Patent No.: US 12,514,629 B2
(45) Date of Patent: Jan. 6, 2026

(54) METHODS AND SYSTEMS FOR CONTROLLING ENERGY DELIVERY TO FILAMENT DEVICES

(71) Applicant: PASSPORT TECHNOLOGIES, INC., San Diego, CA (US)

(72) Inventors: Uros Kascak, La Jolla, CA (US); Arjun Singh Bhungal, La Jolla, CA (US); Megha Chaudhary Sharma, San Diego, CA (US); Hirotoshi Adachi, San Diego, CA (US); Joe Hua, Rosemead, CA (US)

(73) Assignee: PassPort Technologies, Inc., San Diego, CA (US)

( * ) Notice: Subject to any disclaimer, the term of this patent is extended or adjusted under 35 U.S.C. 154(b) by 850 days.

(21) Appl. No.: 17/623,135

(22) PCT Filed: Jun. 24, 2020

(86) PCT No.: PCT/US2020/039437
§ 371 (c)(1),
(2) Date: Dec. 27, 2021

(87) PCT Pub. No.: WO2020/264034
PCT Pub. Date: Dec. 30, 2020

(65) Prior Publication Data
US 2022/0257303 A1    Aug. 18, 2022

Related U.S. Application Data

(60) Provisional application No. 62/868,580, filed on Jun. 28, 2019.

(51) Int. Cl.
*A61B 18/08*    (2006.01)
*A61B 17/00*    (2006.01)
(Continued)

(52) U.S. Cl.
CPC .... *A61B 18/08* (2013.01); *A61B 2017/00154* (2013.01); *A61B 2018/0016* (2013.01);
(Continued)

(58) Field of Classification Search
CPC .......... A61B 18/08; A61B 2017/00154; A61B 2018/0016; A61B 2018/00577;
(Continued)

(56) References Cited

U.S. PATENT DOCUMENTS 6,080,148 A  *  6/2000  Damasco ............... A61B 18/22
                                                                606/2
6,230,051 B1    5/2001  Cormier et al.
(Continued)

FOREIGN PATENT DOCUMENTS

AU    2014202524 A1    5/2014
AU    2016231468 A1    10/2016
(Continued)

OTHER PUBLICATIONS

International Search Report and Written Opinion issued in application No. PCT/US2020/039437, dated Oct. 6, 2020.
(Continued)

*Primary Examiner* — Joseph A Stoklosa
*Assistant Examiner* — Annie L Shoulders
(74) *Attorney, Agent, or Firm* — Knobbe, Martens, Olson & Bear LLP

(57) ABSTRACT

Systems and methods for controlling energy delivered for thermal ablation. An apparatus may include a conductive member comprising an array of conductive filaments, a power supply configured to provide the current to the conductive/resistive member in a plurality of electrical pulses, and a processing circuit coupled to the power supply. The processing circuit is configured to control the supply current value to be greater than or equal to a first current
(Continued)

density and less than or equal to a second current density, and control the pulse length to be greater than or equal to a first pulse length and less than a second pulse length, control the supply current value to have a third current density at a first time and a fourth current density at a second time.

18 Claims, 13 Drawing Sheets

(51) Int. Cl.
  *A61B 18/00* (2006.01)
  *A61B 90/00* (2016.01)
(52) U.S. Cl.
  CPC .............. *A61B 2018/00577* (2013.01); *A61B 2018/00625* (2013.01); *A61B 2018/0072* (2013.01); *A61B 2018/00791* (2013.01); *A61B 2018/00875* (2013.01); *A61B 2090/065* (2016.02)
(58) Field of Classification Search
  CPC ............. A61B 2018/00625; A61B 2018/0072; A61B 2018/00791; A61B 2018/00875; A61B 2090/065
  See application file for complete search history.

(56) References Cited

U.S. PATENT DOCUMENTS

| | | | |
|---|---|---|---|
| 6,922,578 | B2 | 7/2005 | Eppstein et al. |
| 7,141,034 | B2* | 11/2006 | Eppstein ................ A61N 1/044 607/2 |
| 7,384,396 | B2 | 6/2008 | Samuels et al. |
| 7,392,080 | B2 | 6/2008 | Eppstein et al. |
| 7,758,561 | B2 | 7/2010 | Eppstein |
| 7,914,813 | B2 | 3/2011 | Adachi et al. |
| 8,016,811 | B2 | 9/2011 | Smith et al. |
| 8,517,958 | B2 | 8/2013 | Eppstein et al. |
| 8,641,689 | B2 | 2/2014 | Messier et al. |
| 8,706,210 | B2 | 4/2014 | Eppstein et al. |
| 9,144,671 | B2 | 9/2015 | Cantor et al. |
| 9,272,137 | B2* | 3/2016 | Anderson ............ A61K 9/7038 |
| 9,486,616 | B2 | 11/2016 | Eppstein et al. |
| 9,498,609 | B2 | 11/2016 | Tagliaferri et al. |
| 9,579,380 | B2 | 2/2017 | Eppstein |
| 9,918,665 | B2* | 3/2018 | McRae ................ A61N 1/303 |
| 10,010,453 | B2 | 7/2018 | Harima et al. |
| 10,166,378 | B2 | 1/2019 | Tagliaferri et al. |
| 10,206,979 | B2 | 2/2019 | Inoue et al. |
| 2003/0078499 | A1 | 4/2003 | Eppstein |
| 2004/0033254 | A1 | 2/2004 | Song et al. |
| 2004/0039343 | A1 | 2/2004 | Eppstein et al. |
| 2005/0095578 | A1 | 5/2005 | Koller et al. |
| 2005/0181029 | A1 | 8/2005 | Mitragotri et al. |
| 2006/0100278 | A1 | 5/2006 | Cooper et al. |
| 2007/0250018 | A1 | 10/2007 | Adachi et al. |
| 2008/0131492 | A1 | 6/2008 | Nangia et al. |
| 2010/0323375 | A1 | 12/2010 | Maeda et al. |
| 2011/0060270 | A1 | 3/2011 | Eppstein |
| 2011/0190688 | A1 | 8/2011 | Tagliaferri et al. |
| 2014/0228736 | A1 | 8/2014 | Eppstein et al. |
| 2014/0256823 | A1 | 9/2014 | McCarty |
| 2015/0190074 | A1* | 7/2015 | McRae ................ A61B 5/685 600/309 |
| 2015/0342900 | A1 | 12/2015 | Putnins |
| 2017/0246468 | A1* | 8/2017 | Kalghatgi ............... A61N 1/44 |
| 2018/0214917 | A1 | 8/2018 | Valia |
| 2019/0038884 | A1 | 2/2019 | Roux et al. |
| 2019/0070103 | A1 | 3/2019 | Amer et al. |
| 2019/0110981 | A1 | 4/2019 | Weimann |
| 2019/0117947 | A1 | 4/2019 | Tagliaferri et al. |
| 2020/0023173 | A1 | 1/2020 | Smith et al. |
| 2020/0222686 | A1* | 7/2020 | Peiffer .................. A61N 1/303 |
| 2020/0406015 | A1 | 12/2020 | Adachi et al. |
| 2022/0218987 | A1* | 7/2022 | Schwarz ............. A61N 1/0452 |

FOREIGN PATENT DOCUMENTS

| | | |
|---|---|---|
| CA | 2 676 255 A1 | 7/2008 |
| EP | 2319578 A1 | 5/2011 |
| EP | 2423685 A1 | 2/2012 |
| EP | 2674188 A2 | 12/2013 |
| EP | 3 311 762 B1 | 7/2020 |
| EP | 3 411 110 B1 | 8/2020 |
| JP | 6319912 B2 | 5/2018 |
| WO | WO 1997/07734 A1 | 3/1997 |
| WO | WO 2002/04570 A2 | 1/2002 |
| WO | WO 2005/046600 A2 | 5/2005 |
| WO | WO 2006/004595 A2 | 1/2006 |
| WO | WO 2012/075209 A1 | 6/2012 |
| WO | WO 2017/143345 A1 | 8/2017 |
| WO | WO 2020/264025 A1 | 12/2020 |
| WO | WO 2020/264026 A1 | 12/2020 |
| WO | WO 2020/264030 A1 | 12/2020 |
| WO | WO 2020/264032 A1 | 12/2020 |
| WO | WO 2020/264034 A1 | 12/2020 |

OTHER PUBLICATIONS

Araki et al., "Novel Cadherin-related Membrane Proteins, Alcadeins, Enhanced the X11-like Protein-mediated Stabilization of Amyloid β-Protein Precursor Metabolism", The Journal of Biological Chemistry, vol. 278, No. 49, dated Dec. 5, 2003, pp. 49448-49458.

Bekris et al., "Genetics of Alzheimer Disease", J Geriatr Psychiatry Neurol, vol. 23, No. 4, dated Dec. 2010, pp. 213-227.

Extended European Search Report in European Application No. 20832511.8, mailed Jun. 5, 2023, in 9 pages.

Extended European Search Report in European Application No. 20831041.7, mailed Apr. 4, 2023, in 10 pages.

Giannola, et al., "Release of naltrexone on buccal mucosa: Permeation studies, histological aspects and matrix system design" European Journal of Pharmaceutics and Biopharmaceutics 67 (2007) 425-433.

Hanumanaik, M et al., (2012) "Design, Evaluation and Recent Trends in Transdermal Dr" International Journal of Pharmaceutical Sciences and Research 3(08): 2393-2406.

Hata et al., "Alcadein Cleavages by Amyloid β-Precursor Protein (APP) α-and γ-Secretases Generate Small Peptides, p3-Alcs, Indicating Alzheimer Disease-related γ-Secretase Dysfuction", The Journal of Biological Chemistry, vol. 284, No. 52, dated Dec. 25, 2009, pp. 36024-36033.

Hata et al., "Alternative Processing of γ-Secretase Substrates in Common Forms of Mild Cognitive Impairment and Alzheimer's Disease: Evidence for γ-Secretase Dysfunction", Ann Neurol, vol. 69, No. 6, dated Jun. 2011, pp. 1026-1031.

Hata et al., "Decrease in p3-Alcβ37 and p3-Alcβ40, products of Alcadein β generated by γ-secretase cleavages, in aged monkeys and patients with Alzheimer's disease", Alzheimer's & Dementia: Translational Research & Clinical Intervenions 5, dated 2019, pp. 740-750.

International Search Report and Written Opinion, re PCT/US2020/039427, mailed Sep. 4, 2020 in 9 pages.

International Search Report and Written Opinion, re PCT/US2020/39433, mailed Oct. 13, 2020 in 14 pages.

International Search Report and Written Opinion, re PCT/US2020/39435, mailed Oct. 6, 2020 in 14 pages.

International Search Report and Written Opinion, re PCT/US2020/39437, mailed Oct. 6, 2020 in 18 pages.

Jack, Jr. et al., "NIA-AA Research Framework: Toward a biological definition of Alzheimer's disease", Alzheime's & Dementia 14, dated 2018, pp. 535-562.

Li Liu, "A Technique for Serial Collection of Cerebrospinal Fluid from the Cisterna Magna in Mouse", Journal of Visualized Experiments, dated 2008, in 4 pages.

(56) References Cited

OTHER PUBLICATIONS

Murthy, et al., "Bioadhesive Tablets for Controlled Transdermal Delivery of Drugs", PDA Journal of Pharmaceutical Science and Technology, vol. 59, No. 6, Nov.-Dec. 2005, 5 pages.

Omori et al., "Increased Levels of Plasma p3-Alc alpha 35, a Major Fragment of Alcadein alpha by gamma-Secretase Cleaveage, in Alzheimer's Disease", Journal of alzheimers disease, vol. 39, No. 4, dated 2014, pp. 861-870.

Park et al., "Development and evaluation of a biphasic buccal adhesive tablet for nicotine replacement therapy", International Journal of Pharmaceutics 237 (2002) 215-226.

Piaceri et al., "Genetics of familial and sporadic Alzheimer's disease", Frontier's in Bioscience, Elite, vol. 5, dated Jan. 1, 2013, pp. 167-177.

Ridge et al., "Mitochondria and Alzheimer's Disease: the Role of Mitochondrial Genetic Variation", Current Genetic Medicine Reports, vol. 6, dated 2018 in 10 pages.

Subedi, RK et al., (2011) "Influence of formulation variables in transdermal drug deliver", International Journal of Pharmaceutics 419: 209-214.

Tsukada et al., "Novel PET Probes $^{18}$F-BCPP-EF and $^{18}$F-BCPP-BF for Mitochondrial Complex I: A PET Study in Comparison with $^{18}$F-BMS-747158-02 in Rat Brain", The Journal of Nuclear Medicine, vol. 55, No. 3, dated Mar. 2014, pp. 473-480.

\* cited by examiner

| Current Density (mA/μm²) y | Pulse length (ms) | | | | | | | | |
|---|---|---|---|---|---|---|---|---|---|
| | 0.5 | 1 | 2 | 4 | 6 | 8 | 10 | 12 | 16 |
| 0.81 | | | | | | | | | |
| 1.33 | | 48 g/m²hr | | | | | | | |
| 2.00 | | | | 71 g/m²hr | | 14 g/m²hr | 14 g/m²hr | 83 g/m²hr | 20 g/m²hr |
| 2.67 | | | | 90 g/m²hr | | | | 70 g/m²hr | 93 g/m²hr |
| 2.93 | | | 49 g/m²hr | 70 g/m²hr | | 90 g/m²hr | | | 100 g/m²hr |
| 3.23 | | | | | | | | | |

| | |
|---|---|
| ☐ | Safe in air without temperature regulation |
| ☐ | required temperature regulation in air, none on animal skin |
| ☐ | required temp regulation on animal skin, failed in air |
| ☐ | failed with temperature regulation on animal skin |

FIG.5

METHODS AND SYSTEMS FOR CONTROLLING ENERGY DELIVERY TO FILAMENT DEVICES

FIELD

This disclosure relates to thermal tissue ablation or flash vaporization using metallic filaments as a conduit for energy delivery and/or transfer to tissue being ablated. More specifically, this disclosure relates to converting electrical energy to heat for ablating the tissue.

BACKGROUND

During poration of skin, the skin may be ablated using metallic filaments brought to a high temperature by providing electrical energy through the metallic filaments, and transferring generated thermal energy (heat) into the skin through the surface of the skin. Fast introduction of the thermal energy into the skin causes a rapid increase in a temperature of one or more outer layers of the skin and results in ablation of at least a portion of the skin. The instant (or near instant) ablation ensures that the stratum corneum (the most outer protective layer of the skin which prevents ingress of foreign materials into a body protected by the skin and loss of bodily fluids) is removed from the skin. The removal of the stratum corneum provides an opening (sometimes referred to as a "pore") having a depth that is proportional to the electrical energy provided through the metallic filaments.

The epidermis is a layer of the skin which is aqueous and can act as a conduit for a formulated active pharmaceutical ingredient. If the electrical energy provided through the metallic filaments is large enough and delivered quickly enough, the resulting heat ablates the stratum corneum and exposes at least a portion of the epidermis. Providing more energy into the skin will cause more of the epidermis (e.g., the water) to evaporate and result in deeper pores. While deeper and a greater number of pores do not always result in attaining a higher flux rate (for example, some formulations can be affected by molecules found in the interstitial fluid such that having too many pores attenuate flux rate) in many cases deeper pores can facilitate (or provide) a higher flux rate of the formulated active pharmaceutical, thereby providing a sufficiently desirable supply or concentration of the formulated active pharmaceutical via the skin.

SUMMARY

Methods and apparatuses or devices disclosed herein each have several aspects, no single one of which is solely responsible for its desirable attributes. Without limiting the scope of this disclosure, for example, as expressed by the claims which follow, its more prominent features will now be discussed briefly. After considering this discussion, and particularly after reading the section entitled "Detailed Description" one will understand how the described features being described provide advantages that include data authentication services.

One embodiment incudes an apparatus for delivering thermal energy to a biological membrane to cause the ablation of some portion of the membrane deep enough to cause a micropore. The apparatus can include, for example, a porator including an array of conductive filaments, wherein the porator is configured to generate thermal energy heat based on a current flowing through the array of conductive filaments, and provide the thermal energy to a biological membrane positioned adjacent to the porator. The apparatus can also include a power supply circuit configured to provide the current to the porator in a plurality of pulses. Various embodiments of such an apparatus can include one or more other features, including one or more of the features indicated below.

In some embodiments of an apparatus for delivering thermal energy to a biological membrane to cause the ablation of some portion of the membrane deep enough to cause a micropore, the power supply circuit includes a control circuit coupled to the power supply, the control circuit configured to control one or more parameters of the plurality of pulses. In some embodiments, the control circuit controls the one or more parameters to implement a porator thermal warmup process. In some embodiments, the control circuit controls the one or more parameters to implement a porator thermal slow-down process. In some embodiments, control circuit controls the one or more parameters to implement a porator thermal and maintenance process. In some embodiments, the one or more parameters includes a current value representative of an amplitude of the current of at least one of the pulses.

In some embodiments of an apparatus for delivering thermal energy to a biological membrane to cause the ablation of some portion of the membrane deep enough to cause a micropore of an apparatus, the one or more parameters includes a frequency value representative of a frequency of at least a portion of the plurality of pulses. In some embodiments, the one or more parameters includes a pulse width value representative of a pulse width of at least one of the plurality of pulses. In some embodiments, a control circuit controls current values of the plurality of pulses so that control current values are be greater than or equal to a first current density and less than or equal to a second current density, the second current density being greater than the first current density. In some embodiments, the control circuit controls a current value to have a third current density at a first time and a fourth current density at a second time, the third and fourth current densities being between or equal to the first and second current densities, the fourth current density being less than the third current density, and the second time being later than the first time. In some embodiments, the control circuit controls a pulse length of the plurality of pulses to be greater than or equal to a first pulse length and less than a second pulse length, the second pulse length being greater than the first pulse length. In some embodiments, the control circuit is further configured to control the supply current value to flash vaporize a portion of the membrane while minimizing likelihood of filament failure by melting.

Any of the above discussed embodiments may include one or more features described herein, or other features. In some embodiments, a control circuit can be further configured to determine a supply ratio of current to a cross-sectional area of the array of conductive filaments, and control the supply ratio between a first threshold and a second threshold that is greater than the first threshold. In some embodiments, the control circuit is further configured to control pulse length and a pulse period between consecutive pulses of the plurality of pulses together in combination to flash vaporize the skin surface while minimizing likelihood of filament failure by melting. In some embodiments, wherein the power supply circuit is further configured to monitor a temperature of the array of conductive filaments, and control the temperature of the array of conductive filaments to prevent a filament failure from melting or failing into an open circuit state. In some embodiments, the power supply is further configured to monitor a temperature of the array of conductive filaments at least in part based on a resistance of the array of conductive filaments. In some embodiments, the power supply circuit is further configured to monitor a temperature of the array of conductive filaments based at least in part on received sensed temperature information. In some embodiments, the apparatus further includes at least one sensor configured to provide temperature information to the power supply circuit. In some embodiments, the power supply circuit is further configured to determine whether a pressure applied to the skin surface by the conductive member is greater than or equal to a first pressure threshold. In some embodiments, the second pulse length corresponds to a maximum pulse length below which a user of the apparatus experiences painless micro-poration.

Another innovation is a method for delivering thermal energy to a biological membrane to cause the ablation of some portion of the membrane deep enough to cause a micropore. The method can include applying the apparatus with any of the above identified features to the membrane, and controlling electrical pulses provided to the array of conducting filaments to heat the array of conducting filaments to cause ablation of some portion of the membrane deep enough to create at least one micropore.

BRIEF DESCRIPTION OF THE DRAWINGS

These drawings and the associated description herein are provided to illustrate specific embodiments of the invention and are not intended to be limiting.

FIG. 5 is a table illustrating pore creation performance results (measured through a trans-epidermal water loss) of the filament array of FIG. 1A relative to current densities and pulse lengths of energy delivered to the filament array, according to an exemplary embodiment.

DETAILED DESCRIPTION

Figure 1A:
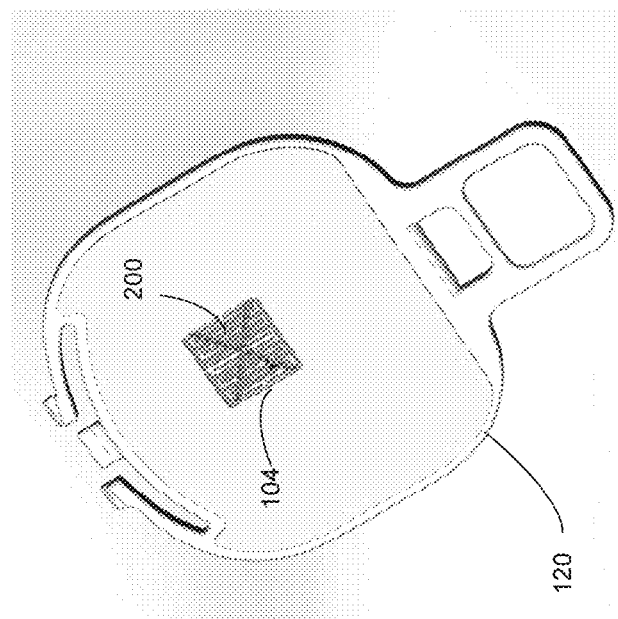
FIG. 1A is a diagram illustrating an example of a thermal ablation system, according to some embodiments.
Figure 1A:
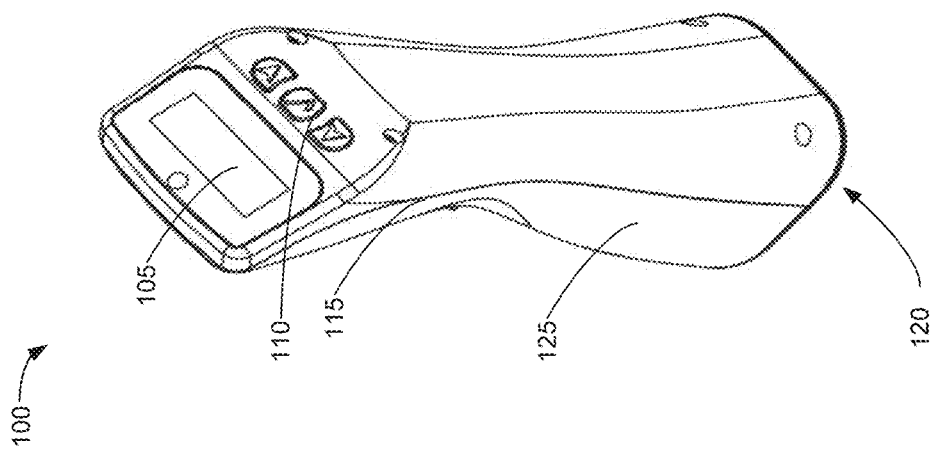

Although certain embodiments and examples are disclosed below, inventive subject matter extends beyond the specifically disclosed embodiments to other alternative embodiments and/or uses and to modifications and equivalents thereof. Thus, the scope of the application is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

In the following detailed description, reference is made to the accompanying drawings, which form a part of the present disclosure. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and form part of this disclosure.

The terminology used herein is for the purpose of describing particular implementations only and is not intended to be limiting on the disclosure. It will be understood that if a specific number of a claim element is intended, such intent will be explicitly recited in the claim, and in the absence of such recitation, no such intent is present. For example, as used herein, the singular forms "a," "an" and "the" are intended to include the plural forms as well, unless the context clearly indicates otherwise. As used herein, the term "and/or" includes any and all combinations of one or more of the associated listed items. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

FIG. 1A illustrates an example thermal ablation system 100 (sometimes referred to herein as an "applicator"), according to some embodiments. In various embodiments the thermal ablation system 100 can be a micro-poration apparatus. The illustrated thermal ablation system 100 includes a housing 125 that at least partially surrounds the various components of the thermal ablation system 100. A portion of the housing 125 may be a body portion 115 configured to be held in the hand of a user. The thermal ablation system 100 also can include a user interface. In various embodiments, the user interface can include a display 105 that is positioned to display information to a user of the thermal ablation system 100, for example, a user that is holding the body portion 115 of the thermal ablation system 100 in their hand. The thermal ablation system 100 also can include one or more controls 110. In various embodiments, the user interface can also include the one or more controls 110. In this embodiment, the one or more controls 110 are accessible to a user's hand that is holding the body portion 115 of thermal ablation system 100. A porator 120 is positioned on one end of the thermal ablation system 100. Various embodiments of a porator 120 may be used in the thermal ablation system 100. The example porator 120 illustrated in FIG. 1A includes a filament array 104 that includes one or more filaments 200 that are operable to delivering thermal energy via direct contact to a biological membrane to cause ablation of some portion of the membrane deep enough to form a micropore.

Figure 1B:
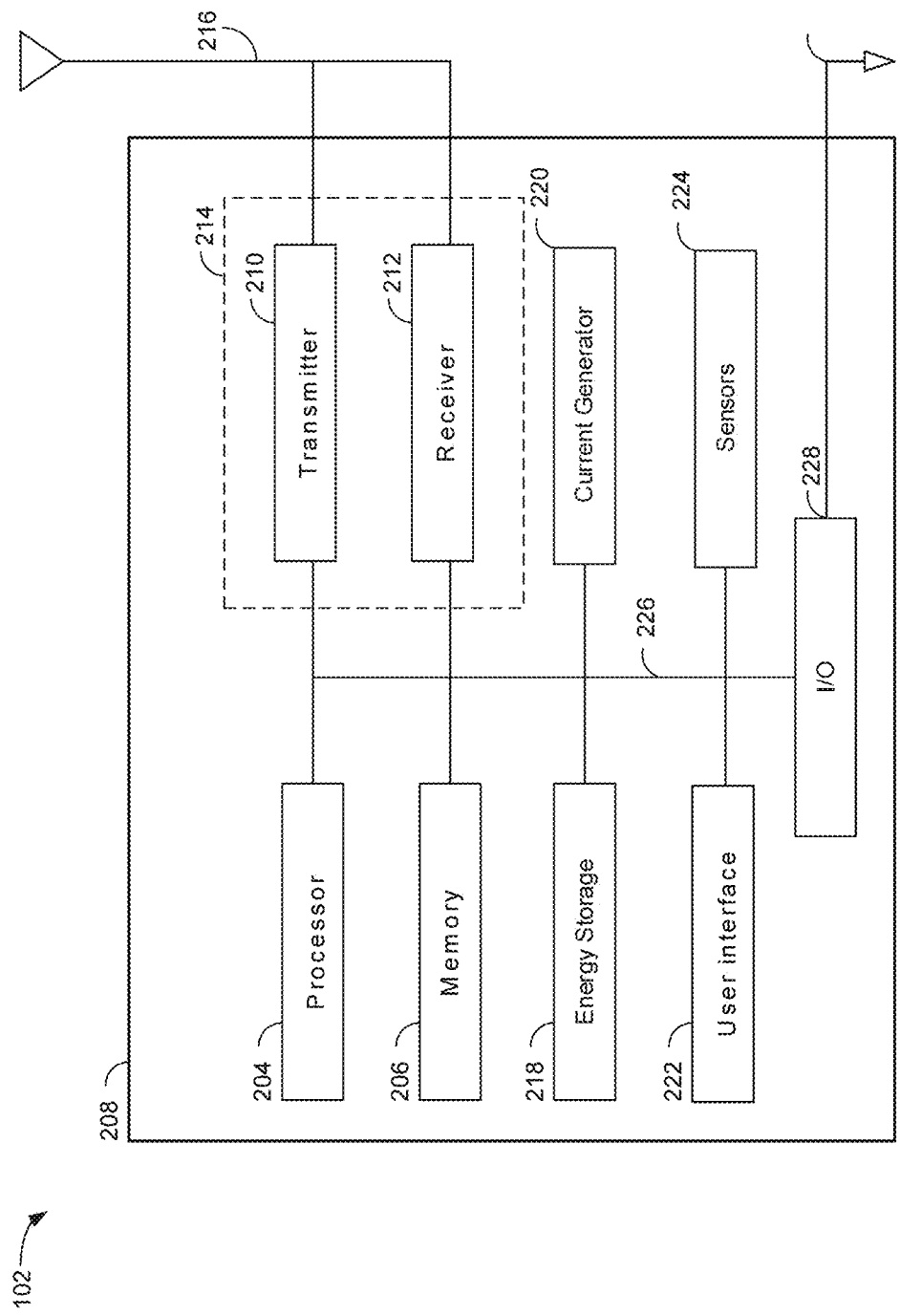
FIG. 1B is a functional block diagram illustrating an example of a control unit of the thermal ablation system of FIG. 1A, according to some embodiments.

FIG. 1B is a functional block diagram 102 illustrating some of the components of an applicator 100 that is configured for thermal ablation, for example, the thermal ablation system f of FIG. 1A, according to an exemplary embodiment. The functional block diagram 102 illustrates an example of components that can be configured to implement and/or control the various functionality described herein. Accordingly, for ease of reference, the functional block diagram 102 may be referred herein as a control unit 102 of the applicator 100. For example, the control unit 102 can control current provided to the porator 120, specifically to the filament array 104. With respect to the description of FIG. 1B herein, some of the item numbers refer to the aspects described above in connection with FIG. 1A. In some implementations, the control unit 102 does not include each of the components shown in FIG. 1B. In some implementations, the control unit 102 includes additional components not shown in FIG. 1B for clarity of illustration. Also, all of the components of the applicator are not illustrated in the control unit 102 shown in FIG. 1B. For example, the control unit 102 is configured to provide current to a filament array 104 (not shown in FIG. 1B) of the applicator 100.

The illustrated control unit 102 includes a processor 204 which controls operation of the control unit 102. The processor 204 may also be referred to as a central processing unit (CPU) or hardware processor or microprocessor unit (MPU). The control unit further includes a memory unit 206, which may include both read-only memory (ROM) and random access memory (RAM), may provide instructions and/or data to the processor 204 and may serve as a repository for storage of instructions and/or data from the processor 204. A portion of the memory unit 206 may also include non-volatile random access memory (NVRAM). The processor 204 typically performs logical and arithmetic operations based on program instructions stored within the memory unit 206 or instructions and/or data received. The instructions in the memory unit 206 may be executable to implement the methods described herein. Furthermore, the control unit 102 may utilize the memory unit 206 to store information about other components in the thermal ablation system 100 to enable the use of certain methods described below, for example, storing particular set points, threshold values, information used to provide power to the porator, and/or operational characteristics for components in the thermal ablation system 100. In some embodiments, the information used to provide power to the porator includes information that can be used to provide electrical pulses to the porator to heat filaments of the porator, for example, one or more processes to provide power to the porator. The control unit 102 may then utilize the processor 204 in connection with the memory unit 206 to analyze the stored data and determine and/or identify various sets, categories, characteristics, or otherwise, for one or more of the other components in the thermal ablation system 100.

The processor 204 may comprise or be a component of a processing system implemented with one or more processors. The one or more processors may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that can perform calculations or other manipulations of information.

The processing system may also include non-transitory machine-readable media for storing software. Software shall be construed broadly to mean any type of instructions, whether referred to as software, firmware, middleware, microcode, hardware description language, or otherwise. Instructions may include code (for example, in source code format, binary code format, executable code format, or any other suitable format of code). The instructions, when executed by the one or more processors, cause the processing system to perform the various functions described herein. The processor 204 may further comprise a packet generator to generate packets for controlling operation and data communication.

The control unit 102 may include networking components, for example, a transmitter 210 and a receiver 212 to allow transmission and reception of data between the control unit 102 and a remote location. The transmitter 210 and the receiver 212 may be combined into a transceiver or network interface 214. The network interface 214 (and/or the transmitter 210 and the receiver 212) may communicate via a communication link 216, which may comprise a wireless or wired communication link. In some implementations, the communication link 216 may comprise a link to a mobile device or other user device used to monitor and/or track usage of the control unit 102 and/or the thermal ablation system 100. The network interface 214 operates with the processor 204 to communicate over the communication link 216.

The control unit 102 is at least partially surrounded by a housing 125. The housing 125 protects the components of the control unit 102 from the environment and provide a packaging that is safe to handle and easy and convenient to use by a user.

The control unit 102 also includes one or more energy storage devices 218. The energy storage devices 218 may comprise a one or more batteries, capacitors, or similar energy storage components. The energy storage devices 218 provides energy to the components of the control unit 102 when the control unit 102 is in operation (for example, operating in the thermal ablation system 100).

In some implementations, the control unit 102 includes one or more circuits or sensors 224 configured to monitor an operation or a condition of one or more components of the control unit 102. For example, the sensors 224 may detect a state of charge and/or a state of health of the energy storage device(s) 218. Additionally, and/or alternatively, the sensors 224 may detect conditions of one or more components of the control unit 102 indicative of a malfunction of the control unit 102. For example, the sensors 224 may detect when one or more of the filaments has "blown" or is in an open circuit state or is deteriorating and approaching an open circuit state. Alternatively, or additionally, the sensors 224 may detect when too large or too small of a voltage or current is being conveyed to the filaments and/or when a temperature of the filaments is above, below, or at a desired threshold. In some implementations, the sensors 224 may be configured to monitor operation of the processor 204. Should the sensors 224 detect an overvoltage or over temperature condition or determine that the processor 204 is non-responsive, and then the sensors 224 may generate an output. In some implementations, the output from the sensors 224 may be communicated via the transmitter 210 or the network interface 214 over the communication link 216. In some implementations, the output from the sensors 224 may be communicated internally to another component of the control unit 102, for example the processor 204 or a user interface 222, described further below.

In some implementations, when the control unit 102 is initialized and/or when the thermal ablation system 100 is activated, the sensors 224 perform an initial check to ensure all connections are proper and that all components of the thermal ablation system 100 are in proper operating condition. Accordingly, the control unit 102 may perform an initial check of the thermal ablation system 100 to determine if any malfunction exists. If no malfunction is detected in or by the control unit 102, then the control unit 102 begins providing a current to the filaments. If a malfunction is detected, then the control unit 102 may be prevented from providing a current to the filaments. Accordingly, the sensors 224 may function in or act as a safety circuit and prevent operation of the thermal ablation system 100 in a malfunction state.

In some embodiments, the sensors 224 and/or the processor 204 may monitor a temperature of the conductive member. The processor 204 may further control the temperature of the conductive member to prevent filament failure, wherein the filament failure results in one or more filaments melting or failing into an open circuit state. In some embodiments, the temperature is determined based on the sensors 224 identifying a resistance of the conductive member and wherein controlling the temperature to prevent the filament failure comprises controlling the temperature to prevent the filament failure while the conductive member is in contact with at least one of the skin surface and air.

The control unit 102 also includes a current generator 220. The current generator 220 generates a current signal which is provided to the filaments, as described herein. In some implementations, the current signal can include one or more pulses. In some implementations, the pulses are varied to have one or more durations (e.g., periods of time), amplitudes, etc., to control a temperature of the filaments and create pores in skin. In some implementations, the current signal may be a periodic pulse. In some implementations, the current signal may have a constant amplitude, while in others the current signal can include pulses of two or more different amplitudes. In some implementations, the current signal has a constant frequency, while in other implementations the current signal includes sets of pulses at two or more different frequencies. For example, the current generator 220 may generate the current signal which is conveyed, via the control unit 102, to the filament array 104 with different properties during different periods or time. During a first period of time, the current signal may be generated with a first set of attributes. For example, as a single pulse or as two or more pulses with the same or similar amplitude, and/or as a set of pulses with a certain frequency. During a second period of time (e.g., a subsequent period of time), the current signal may be generated with a second set of attributes. For example, as one or more pulses having an amplitude that is different than the amplitude of pulses generated during the first period of time, and/or as one or more pulses having a different frequency as the pulses generated during the first period of time.

In some implementations, based on the conditions detected using the sensors 224 or a command from the processor 204, the processor 204 allows or interrupts the generation and conveyance of the current signal to the filaments. In some implementations, interrupting the generation and conveyance of the current signal comprises terminating the current signal or reducing the current signal.

In some implementations, a pulse can have an associated voltage of between 1 and 42 VAC. For example, in various implementations a pulse can have an alternating current voltage of 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, or 42 VAC. In some implementations, the voltage can be greater than 42 VAC. In some implementations, the duration of a pulse can be 1, 2, 3, 4, 5, 6, 7, 8, 9, 10, 11, or 12 milliseconds. In some implementations, the duration of a pulse can be greater than 12 ms. As the duration of the pulse increases (for example, as it gets closer to 16 ms) a patient may start to feel heat, regardless of how low the current is. In some implementations, the pulse may have a length or period that may be adjusted based on application requirements.

The control unit 102 further comprises a user interface 222, in some aspects. The user interface 222 may comprise a keypad and/or a display. The user interface 222 allows the user to control operation of the control unit 102 and/or the thermal ablation system 100. The user interface 222 may include any element or component that conveys information to the user of the control unit 102 and/or receives input from the user.

The control unit 102 further comprises an input/output (I/O) circuit component 228. In some implementations, the I/O circuit 228 may comprise a component that permits coupling of the control unit 102 to one or more other components in the thermal ablation system 100, such as the filaments. In some embodiments, the I/O circuit 228 includes a connector (for example, a universal serial bus (USB) connector, a proprietary connector, or any other connector) that physical connects the control unit 102 to the other component(s). In some implementations, the I/O circuit 228 comprises a component that detects an improper connection between the control unit 102 and/or the other component(s).

Various components of the control unit 102 may be coupled together by a bus system 226. The bus system 226 may include a data bus, for example, as well as a power bus, a control signal bus, and a status signal bus in addition to the data bus. Those of skill in the art will appreciate various components of the control unit 102 may be coupled together or accept or provide inputs to each other using some other mechanism.

Although a number of separate components are illustrated in FIG. 1B, those of skill in the art will recognize that one or more of these components may be implemented not only with respect to the functionality described above, but also to implement the functionality described above with respect to other components. For example, the processor 204 may be used to implement not only the functionality described above with respect to the processor 204, but also to implement the functionality described above with respect to the current generator 220 and/or the sensors 224. Each of the components illustrated in FIG. 1B may be implemented using a plurality of separate elements.

In some embodiments, one or more components of the control unit 102 may provide for locking of the control unit 102 such that the thermal ablation system 100 cannot be abused or improperly used. Additionally, or alternatively, one or more components of the control unit 102 may count uses of or doses provided by the thermal ablation system 100 and/or provide reminders regarding upcoming doses. In some embodiments, the network interface 214 may be used to communicate with a physician or pharmacy regarding refills of the formulated pharmaceutical as needed or to change the dosage, etc. In some embodiments, the user interface 222 may provide personalization of the thermal ablation system 100 and provide voice prompts, guiding lights, etc., to simplify operation of the thermal ablation system 100.

In the thermal ablation system 100 of FIG. 1A, the current signal generated by the current generator 220 of the control unit 102 and applied to the filament array 104 causes the filament array 104 to become heated and act as an energy/heat delivery medium. The filament array 104 provides sufficient amounts of energy/heat to the skin to ablate at least a surface (i.e., the stratum corneum) of the skin. In some embodiments, the amount of energy/heat conveyed to the skin by the filament array 104 is varied by varying the current that is delivered to the filament array 104 or by varying an amount of time that the filament array 104 conveys energy to the skin. For example, the current generator 220 may vary the amount of time that the filament array 104 conveys energy to the skin. In some embodiments, the amount of time may be varied by varying an amount of time that the filament array 104 is in contact with skin and/or by varying a pulse length of the current delivered to the filament array 104. For example, the current generator 220 may vary the pulse lengths of the current signal. In order to perform skin ablation, the current applied to the filament array 104 may cause the temperature of the filament array 104 to be above a melting point of the stratum corneum and the epidermis but below the melting point of the filament array 104. In some embodiments, a target temperature for ablation by the filament array 104 may be approximately or substantially 123° C.

Figure 2B:
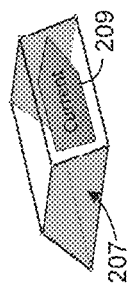
FIG. 2B is a perspective view illustrating an example of a filament of a filament array, showing a cross-sectional area and a current flow direction, according to some embodiments.
Figure 2A:
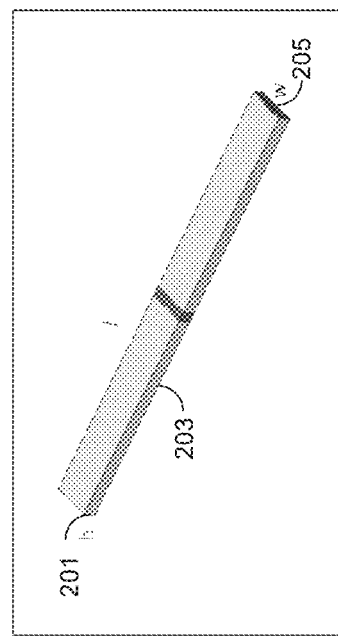
FIG. 2A is a perspective view illustrating an example of a filament of a filament array that can be part of the thermal ablation system of FIG. 1A, according to some embodiments.

FIG. 2A is a perspective view of a filament 200 of the filament array 104 of the thermal ablation system 100 of FIG. 1A, according to an exemplary embodiment. As shown, the filament 200 has a three-dimensional shape and has a height 201, a length 203, and a width 205. The filament 200 is formed from or comprises a conductive material (for example, stainless steel, or another a metallic or similarly conductive material). In some embodiments, the filament 200 may be a microfilament or similar filament. For example, the filament 200 may be 50 μm wide, 15 μm thick, and 400 μm long. While the filament 200 shown has the shape of a generally rectangular block or prism, the filament 200 may have any other shape, such as a trapezoidal shape. The shape of the filament can be also, but is not limited to, a serpentine strip, oval, circular or oval ring, have a varying width, or be "x" shaped or star shaped. The shape of the cross-section 207 of the filament can be, but is not limited to, square, rectangular, trapezoid, oval, crescent. Filaments can be planar (where X and Y dimensions are in one plane, or substantially in one plane) or three dimensional (3D), bent at some portion of the length between two anchor points on the end.

The filaments 200 may create pores in the skin by transferring sufficient energy from the filament 200 to the skin to ablate the stratum corneum to expose the epidermis. The amount of energy transferred from the filament 200 to the skin may be based on a temperature difference between the skin and the filament 200, the material of the filament 200, properties of the skin (for example, skin type, morphology, elasticity, hydration, and thermodynamic parameters of skin layers), and also contact/pressure between the filaments 200 and the skin. In some embodiments, a vacuum may be used to increase contact between the filaments 200 and the skin. For example, the porator comprising the filament array 104 may include holes or other structures that, when connected to a vacuum, cause the skin to be "sucked" toward the holes or structures, increasing contact between the filaments 200 and the skin. In some embodiments, a portion of the filaments 200 can be bent and protrude from a plane that the filament array is generally aligned with, thus creating extra pressure points.

In some embodiments, the control unit 102 may determine whether a pressure applied to the skin surface by the conductive member (e.g., the filament array 104) is greater than or equal to a first pressure threshold. For example, in some embodiments the control unit 102 can receive information from at least one sensor 224 and use the received information to determine whether a pressure applied to the skin surface by the conductive member is greater or equal to a first pressure threshold. In some embodiments, the control unit 102 can use the processor 204 information to determine whether a pressure applied to the skin surface by the conductive member is greater or equal to a first pressure threshold, for example, by comparing sensed pressure information against one or more pressure values (e.g., threshold values) stored in memory.

FIG. 2B is a perspective view of the filament 200 of FIG. 2A, showing a cross-sectional area 207 and a current flow direction 209, according to an exemplary embodiment. As shown, the cross-sectional area 207 is a trapezoid and the current flows through the filament 200 in the current flow direction 209. The cross-sectional area 207 of the filament 200 may be any shape (for example, a square, a rectangle, a circle, an ellipse, a triangle, another polygon, etc.). In various embodiments, the current flow may be in a direction substantially normal to the cross-sectional area 207 of the filament 200. Based on the current flowing through the filament 200 and the cross-sectional area 207, a current density/flux can be determined, according to Equation 1 below:

$$\text{Current Density} = I/A \quad \text{(Equation 1)}$$

Where:
 I—Current through the filament 200, and
 A—cross-sectional area of the filament 200.

Based on the Equation 1, as the cross-sectional area of the filament 200 increases, the corresponding current must be increased in order to maintain the current density. As the length of the filament 200 increases, the resistance of the filament 200 may correspondingly increase, causing an increase in voltage and power for the increased mass of the filament 200.

The current density of the filament 200 may be used to identify an operational range of the filament array 104 that creates viable pores without inflicting pain or damaging the filament array 104, as will be described in further detail below. The depth of the pore created in the skin is proportional to the energy delivered to the skin via the filaments 200.

In some embodiments, the control unit 102 (for example, via the processor 204) determines a supply ratio of the current signal to the cross-sectional area of the filament 200. The control unit 102 further controls the supply ratio to be between a first threshold value and a second threshold value, the second threshold value being is greater than the first threshold value. In some embodiments, the first and/or second threshold values are predetermined and can be stored in memory (e.g., memory 206 of the control unit 120). In some embodiments, the first and/or second threshold values are dynamically during operation, for example, using information from a sensor that senses a characteristic of a filament or of skin (e.g., temperature). In some embodiments, the first and/or second threshold values are downloadable and stored in a memory of the system, for example, memory 206 of the control unit 120).

Figure 3A:
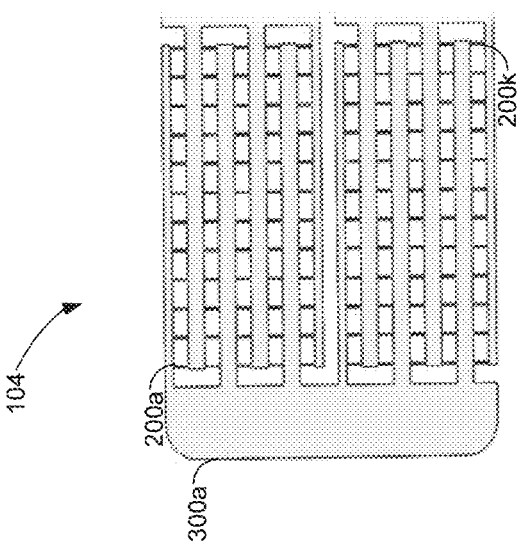
FIG. 3A is a top view illustrating a representation of a filament array of a thermal ablation system, for example, the thermal ablation system shown in FIG. 1A, the filament array including a plurality of filaments, according to some embodiments.

FIG. 3A is a top view of a representative filament array 104 of the thermal ablation system 100 of FIG. 1A comprising a plurality of the filaments 200 of FIG. 2, according to an exemplary embodiment. The filament array 104 includes the plurality of filaments 200 disposed between conductive supporting members or structures 300. Though not shown in FIG. 3A, the conductive supporting member 300 may be coupled to a power source. Although FIG. 3A illustrates one embodiment of the configuration/design of the structure of a filament array 104, such filament arrays are not limited to this configuration/design. Instead, other configurations/designs of filament arrays are also possible, as discussed herein.

Figure 3B:
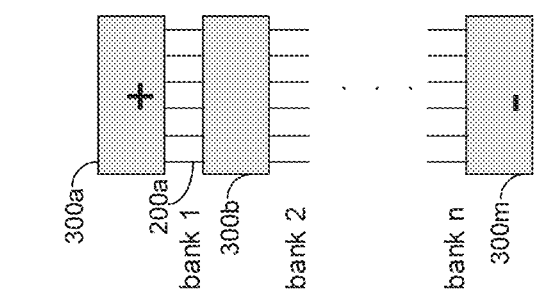
FIG. 3B is an electrical schematic illustrating portions of a filament array, for example, the filament array shown in FIG. 3A, according to some embodiments.

In some embodiments, the conductive supporting members 300 are made of copper or a similar conductive material. In some embodiments, the conductive supporting members 300 are the same material as the filaments 200. In some embodiments, the conductive supporting members 300 are a different material from the filaments 200. As shown in FIG. 3B, the conductive supporting member 300a includes fingers or similar projections 301 between which the filaments 200a-200k are disposed, where 1<k. Though not shown, a corresponding conductive supporting member 300b may exist with fingers 301 interleaved with the fingers 301 of the conductive supporting member 300a.

The conductive supporting members 300 provide structural support to the filaments 200 by holding the filaments 200 in place between the fingers of the conductive supporting members 300. Additionally, and/or alternatively, the conductive supporting members 300 conductively couple the filaments 200 to the power source.

FIG. 3B is a schematic illustrating one example of the filament array 104 of FIG. 3A, according to an exemplary embodiment. FIG. 3B shows the conductive supporting member 300a with a bank (bank 1) of filaments 200 disposed between the conductive supporting member 300a and a conductive supporting member 300b. Where there are n banks of filaments 200, there is a number m of conductive supporting members 300 to support the n banks of filaments 200, where 1≤n<m. As shown, the conductive supporting members 300a-300m provide the conductive connections between each of then banks of filaments 200 and the power source, indicated by the "+" and "−" symbols on the conductive supporting members 300a and 300m, respectively.

In some embodiments, using one or more components of the thermal ablation system 100 to control or vary an amount of time that the filaments 200 provide energy (e.g., thermal energy) to the skin may be simpler and more efficient than controlling the amount of current (e.g., the amplitude) provided through filaments 200. For example, such control of the amount of time may utilize fewer components than a system that controls or varies the amount of current delivered to the filaments 200. However, when controlling or varying the amount of time that the filaments 200 provide energy to the skin, the control unit 102 may prevent a slow rise in the temperature of the skin that can result in damage (e.g., burning or drying) of the top layers of the skin, for example, the stratum corneum and/or the epidermis. Damaging the top layer(s) of the skin may create a charcoaled/dried layer of dead tissue of the skin. This layer of dead tissue may obstruct heat distribution from the filaments 200 into deeper layers of the skin (for example, the epidermis) and prevent the creation of viable pores for delivery of the formulated active pharmaceutical. Additionally, damaging the skin may trigger a nerve reaction in the skin that causes or is interpreted as pain. Accordingly, the duration of providing energy to the filaments (e.g., in an electrical pulse) or the duration of time during which the filaments 200 are in contact with the skin is preferably less than a time that will cause such damage to the skin.

Additionally, providing a higher amount of current through the filaments allows the filaments to reach a target temperature in a shorter period of time, as compared to providing a relatively lower amount current through the filaments. Also, a higher amount of current shortens the time needed to create a desired pore size, thus reducing or eliminating the risk of a nerve reaction to the heat from the filaments, and reducing or eliminating pain associated with the ablation.

When the current generator 220 and the control unit 102 supply a large current to the filament array 104 of the porator 120, the individual filaments 200 in the filament array 104 experience a rapid increase in temperature. The increase in temperature of the filaments 200 (and, correspondingly, the filament array) may shorten a time needed to create target pore size. Thus, the risk of the nerve reaction to the heat due to cooking and/or drying is reduced or eliminated and the pain associated with the ablation may be reduced or eliminated.

As described above, the filaments 200 convey the energy/heat from the power source to a surface, for example, the skin of a patient. Each filament 200 has one or more properties that may impact the energy/heat conveyance to the skin. For example, the filament 200 has an electrical resistance that depends on the material used for the filament and the mechanical shape of the filament. An amount of energy supplied to and by the filament is based on a current applied to the filament 200 (i.e., based on the current generated by the current generated 220), the electrical resistance of the filament 200, and the size of the filament. The energy supplied to the filament can be calculated using Equations 2 and 3 below:

$$E = P*t = I*U*t = I^2*R_f*t = U^2/R_t*t \quad \text{(Equation 2)}$$

$$R_f = \rho * 1/(w*h) \quad \text{(Equation 2)}$$

Where:
E—energy,
P—power,
t—time,
I—current flowing through the filament 200,
U—voltage on the end of the filament 200,
$R_f$—resistance of the filament 200,
ρ—specific material resistivity of the filament 200,
l—length of the filament 200,
w—width of the filament 200, and
h—height (thickness) of the filament 200.

An amount of energy supplied to and by the filament array 104 is based on a current applied to the filament array 104 (i.e., based on the current generated by the current generated 220) and the overall resistance of the filament array 104. The overall resistance of the filament array 104 is determined by averaging the filaments 200 of the filament array 104. The energy supplied to and by the filament array 104 can be calculated using Equations 4 and 5 below:

$$E = P*t = I*U*t = I^2*R_a*t = U^2/R_a*t \quad \text{(Equation 4)}$$

$$R_a = R_f/N_{fb}*N_b) \quad \text{(Equation 5)}$$

Where:
E—energy,
P—power,
t—time,
I—current flowing through the filament array 104,
U—voltage on filament array 104 contacts, and
$R_a$—average resistance of the filament array 104 (depends on the bank configuration and the array configuration).

Figure 3C:
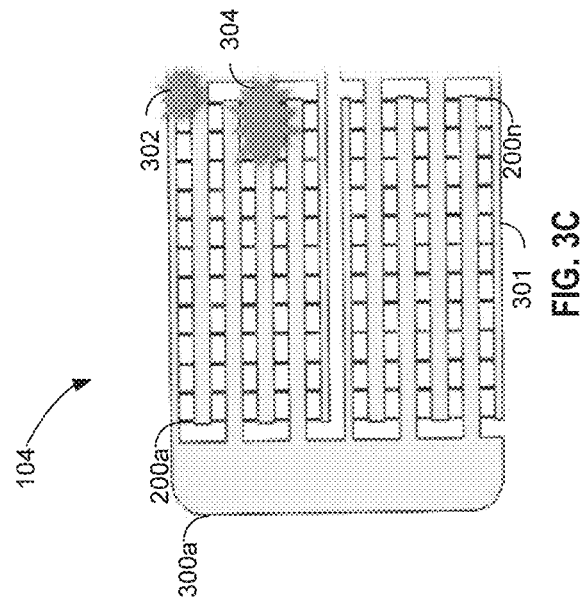
FIG. 3C is a top view of a representation of a filament array that has one or more filament failures.

FIG. 3C is a top view of the filament array 104 of FIG. 3A experiencing one or more filament failures 302 and 304, according to an exemplary embodiment. A filament failure occurs when one or more of the filaments 200 of the filament array 104 are damaged and/or destroyed such that the damaged or destroyed filament 200 is unable to conduct the generated current from the current generator 220 to the skin. For example, if one of the filaments 200 is cut, broken, or melted such that the filament 200 does not connect two fingers 301 of the conductive supporting members 300, then that filament 200 is broken, blown, or otherwise failed. Accordingly, when in a failed state, the filament 200 effectively acts as an open circuit between the fingers 301 of the conductive supporting members 300. The filament failures 302 and 304 correspond to individual failed filaments 200 that no longer provide a conductive path between the respective fingers 301 of the conductive supporting members 300 to which the failed filaments 200 are coupled.

In some embodiments, the failure of one of the filaments 200 in the filament bank between two fingers 301 may cause a cascading filament failure. For example, when a first filament 200a in the filament bank 1 fails, the remaining filaments 200 in the filament bank 1 experience an increase in power flow due to the lost path through the failed filament 200a. This increased power flow through the remaining filaments 200 in the filament bank 1 increases a risk of one or more of the remaining filaments 200 failing as well. While the failure of just the filament 200a may not initiate the cascading (avalanche) effect in the remaining filaments 200 of the filament bank 1, if a sufficient number of filaments 200 in the bank 1 fail (for example, about 5% of the filaments 200 in the bank 1), the cascading filament failure may occur. Accordingly, eventually all the filaments 200 in the bank 1 will fail, causing a complete cascade failure, or open failure. An amount of time that passes between the initial filament failures and the resulting complete cascade failure depends of the amount of current/energy supplied to the filaments 200 that is not dissipated into one of three manners, described below.

In some embodiments, the filaments 200 are cooled, by which the energy supplied to the filament 200 is dissipated. Three ways in which such dissipation occurs include: (1) radiation of heat into air, (2) conduction of the heat into the filament array 104 (for example, the copper structure), and (3) conduction of the heat into the skin. Radiation of the heat from the filament 200 into the air is a relatively small amount of heat loss compared to the heat conduction into the filament array 104 or into the skin. Accordingly, the radiation heat loss may generally be ignored.

The conduction of the heat (back) into the conductive supporting structure 300 is relatively large because the conductive supporting structure 300 is substantially metal, which has high thermal conductivity. An amount of heat loss due to conduction into the conductive supporting structure 300 can be quantified using thermal laws of physics and known material properties, and will not be described in detail herein.

As noted above, the conduction of heat to the skin depends on various properties of the skin, including at least one or more of skin type, morphology, elasticity, hydration, and thermodynamic parameters of skin layers, and also contact/pressure between the filament array 104 and the skin. The relevant properties of the skin may change during poration, as different layers of skin may have different properties or characteristics that affect heat conduction. For example, as the dry stratum corneum (having a laminar structure that has varying consistency and thickness between different entities with skin) is ablated with the filament array 104, the epidermis is exposed, which is generally more hydrated and has different properties than the dry stratum corneum.

As previously described, the electrical resistance (and thus temperature achieved) of the filament 200 is proportionate to the size and/or shape of the filament 200 and the energy (i.e., the generated current from the current generator 220) delivered to the filament 200. To accommodate various sizes, shapes, and energies, the relationships can be normalized using the current density defined by Equation 1 above. Based on the current densities defined by Equation 1, the operating constraints that result in failure of the filaments 200, and operating constraints that result in ablation of the stratum corneum, a range of desirable current densities is defined. The defined range of current densities identifies those current densities that, if delivered to the filaments 200, create viable pores without inflicting pain or damaging the filament array.

Figure 4:
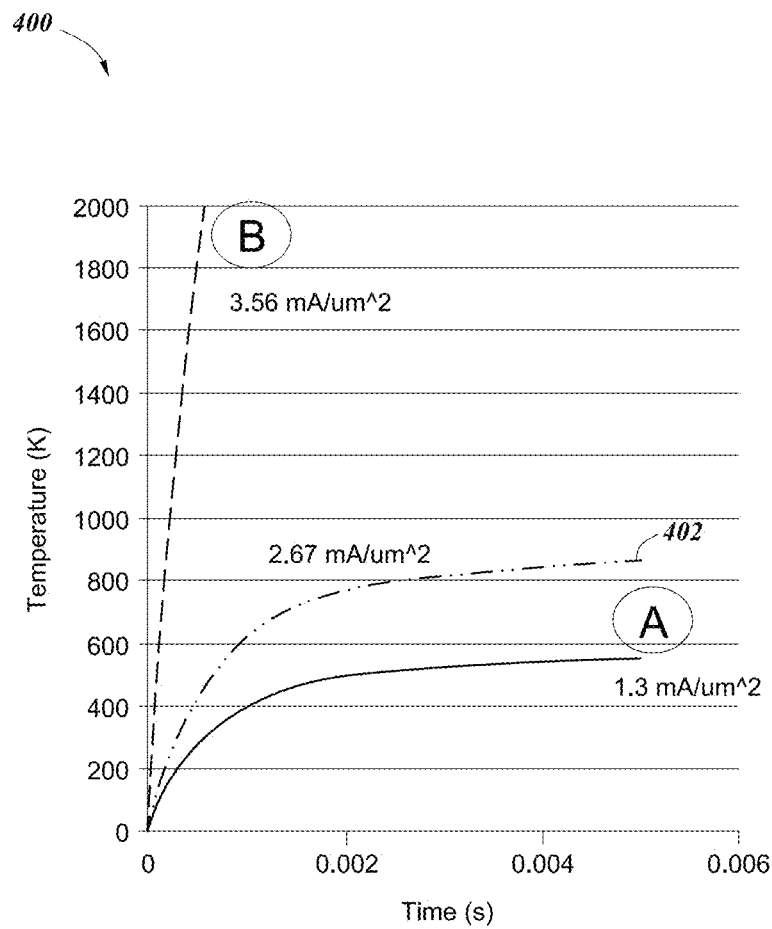
FIG. 4 is a graph showing temperature (Kelvin) on the y-axis as a function of time (seconds) on the x-axis from two current densities applied to a filament array.

FIG. 4 is a graph 400 showing current densities applied to the filament 200 of FIG. 1A, according to an exemplary embodiment. The graph 400 includes temperature (in Kelvin, K, along the y-axis) as a function of time (in seconds, s, along the x-axis). The graph 400 shows three lines. The line A (1.3 mA/$\mu m^2$) represents the minimum operating constraints that result in ablation of the stratum corneum. Thus, current densities that fall below 1.3 mA/$\mu m^2$ do not result in temperatures that cause ablation of the stratum corneum. The line B (3.56 mA/$\mu m^2$) represents the operating constraints that result in failure of the filaments 200 or cause pain when the filament array 104 with that current density is applied to the skin Thus, current densities that fall above 3.56 mA/$\mu m^2$ result in uncontrolled filament temperatures and cause filament failures, complete cascade failure, and/or pain. The line 402, falling between lines A and B, represents an exemplary current density that is sufficient to result in ablation of the stratum corneum without causing filament failure or pain. Thus, an area between the lines A and B represents current densities that will result in ablation without damaging or destroying the filament array 104 or causing pain to or damaging the skin.

In some embodiments, the control unit 102 of the thermal ablation system 100 is configured to control (for example, via the processor 204) the current generator 220 to generate the current signal such that the current density at the filament 200 is greater than or equal to a first current density (for example, the current density represented by the line A). Additionally, the current signal may be generated such that the current density at the filament 200 is less than or equal to a second current density (for example, the current density represented by the line B). As described above, the current density of the line B is greater than the current density of the line A.

FIG. 5 is a table 500 showing pore creation performance results of the filament array 104 of FIG. 1A relative to current densities and pulse lengths of energy delivered to the filament array 104, according to an exemplary embodiment. The columns of the table 500 show various pulse lengths (in milliseconds) that represent pulse lengths of the generated current signal presented to the filament array 104. The rows of the table 500 show various current densities (in mA/$\mu m^2$), that represent average current densities of filaments 200 in the filament array 104. The body of the table 500 shows that particular combinations of current density and pulse length generate particular performance results.

The performance results depicted in the table 500 show which combination of pulse length and current density result in thermodynamic stability of the filament array 104 while creating pores through the stratum corneum to the epidermis. The thermodynamic stability was quantified by a consistent temperature on the filament arrays 104 as well as optimized switching (<2 switches per 500 us. Optimized switching refers to the process where control unit (CPU) 204 modulates current delivered to the filament array 104. For example, switching the current provided to the filament array on and off in a series of pulses. This switching is done to keep the temperature of the filaments relatively constant, and to keep the temperature from reaching a melting/blow/failure point, while heating the filament array to be hot enough to desired effects. This can be done by using (e.g., setting) appropriate pulse parameters and comparing them to the readings from sensors 224. The performance results depicted in the table 500 also show which combination of pulse length and current density need energy regulation/compensation of the filament array 104 while creating pores through the stratum corneum to the epidermis. For the performance results in the table 500, the filaments 200 in the filament array 104 were 50 µm wide, 15 µm thick, and 400 µm long and made of stainless steel.

As shown in table 500, the combination of pulse lengths between 0.5 ms and 16 ms and current densities of 0.81 mA/$\mu m^2$ are safe in air without additional temperature regulation. Similarly, the combination of pulse lengths between 0.5 ms and 10 ms and current densities of 1.33 mA/$\mu m^2$ are safe in air without additional temperature regulation. However, as discussed above, current densities below 1.5 mA/$m^2$ may be insufficient to create pores through the stratum corneum to the epidermis. At the current densities below 1.5 mA/$\mu m^2$, the heat from the filaments 200 is absorbed and dissipated in the skin faster than ablation occurs. Thus, these combinations of pulse lengths and current densities may be insufficient to create the desired pores.

The combination of pulse lengths between 0.5 ms and 2 ms and current densities of 2.00 mA/$\mu m^2$ creates pores through the stratum corneum to the epidermis without additional temperature regulation (of the skin or the filament array 104) even in the air where heat conduction is very low. Similarly, the combination of pulse lengths between 0.5 ms and 1 ms and current densities of 2.67 mA/$\mu m^2$ creates pores through the stratum corneum to the epidermis without additional temperature regulation (of the skin or the filament array 104).

The combination of pulse lengths between 12 ms and 16 ms and a current density of 1.33 mA/$\mu m^2$ and the combination of pulse lengths of 4 ms and a current density of 2.00 mA/$\mu m^2$ requires some form of temperature control or compensation (i.e., temperature regulation) in air but create pores without any additional temperature regulation on animal skin.

The combination of pulse lengths between 0.5 ms and 8 ms at a current density of 3.23 mA/$\mu m^2$ creates the pores in the stratum corneum while requiring, on animal skin, additional temperature regulation and failing in the air. The combination of pulse lengths between 0.5 ms and 16 ms at a current density of 2.93 mA/$\mu m^2$ also creates the pores in the stratum corneum while requiring, on animal skin, additional temperature regulation and failing in the air. The combination of pulse lengths between 2 ms and 16 ms at a current density of 2.67 mA/$\mu m^2$ creates the pores in the stratum corneum with additional temperature regulation on animal skin but fails in the air. The combination of pulse lengths between 6 ms and 16 ms at a current density of 2.00 mA/$\mu m^2$ ablates the stratum corneum on animal skin with additional temperature regulation and fails in the air. The combination of pulse lengths between 10 ms and 16 ms at a current density of 3.23 mA/$m^2$ fails both with temperature regulation on animal skin and in air.

Figure 6:
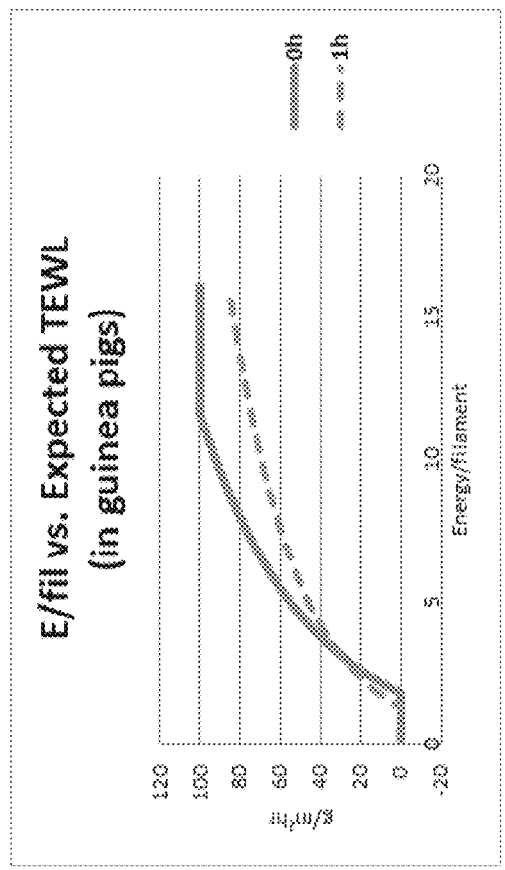
FIG. 6 is a graph illustrating trans-epidermal water loss (TEWL) (y-axis) as a function of energy per filament (x-axis) of a filament array.

FIG. 6 is a graph showing trans-epidermal water loss (TEWL) as a function of energy per filament of a filament array, according to an exemplary embodiment.

Figure 7:
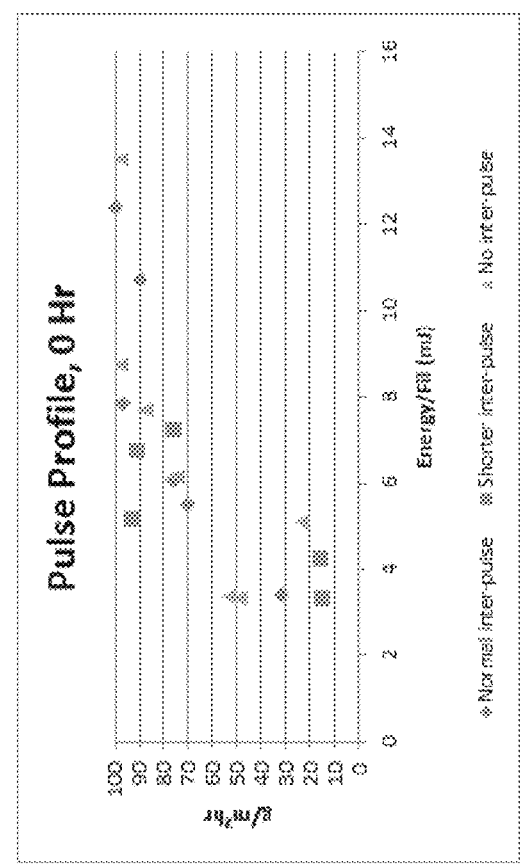
FIG. 7 is a graph illustrating a pulse profile showing a relationship of TEWL (y-axis) to energy (x-axis) provided via pulses to an embodiment of a filament array.

FIG. 7 is a graph showing a pulse profile showing a relationship of trans-epidermal water loss (TEWL) (y-axis) to energy delivered via pulses to the filament array (x-axis) of FIG. 1A, according to an exemplary embodiment. TEWL correlates to the drug delivery (diffusion of the API into the skin). FIG. 7 illustrates that for the lower energies, it is better to have a long uninterrupted pulse, rather than pulse with high current density which needs to be modulated by the control unit (e.g., the CPU) to prevent blowing of filaments.

For the higher energy deliveries, a specific (e.g., optimal) current density can be used, or a current density that is slightly higher or slightly lower than a determined optimal current density.

Figure 8:
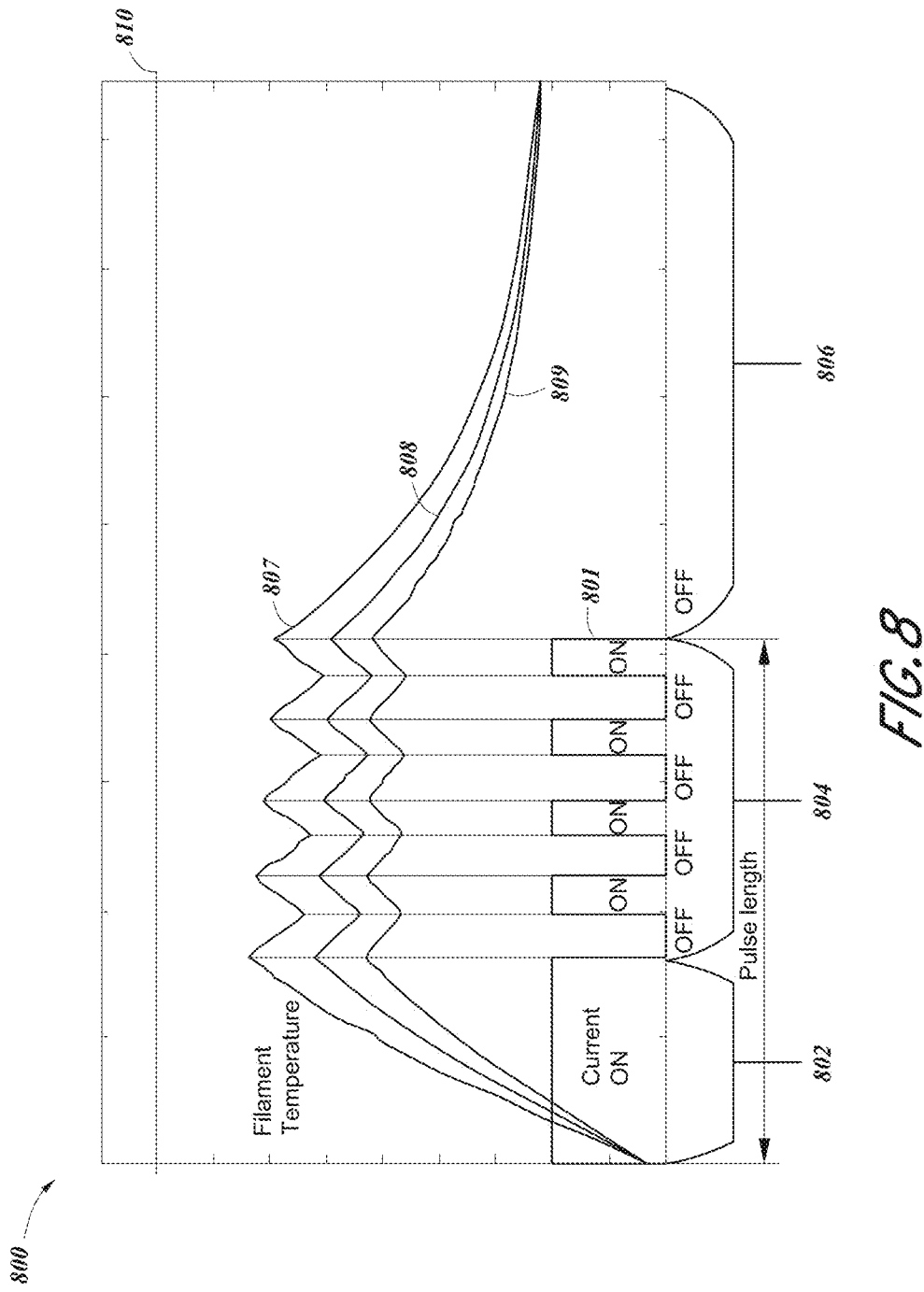
FIG. 8 is a graph illustrating filament temperature (y-axis) of a filament array, the filament temperature resulting from providing energy to the filament array in the form of a plurality of pulses, according to some embodiments.

FIG. 8 is a graph 800 showing filament temperature control of the filament array 104 of FIG. 1A as it relates to control of energy pulses delivered to the filament array 104, according to an exemplary embodiment. The graph 800 shows filament temperature along, the y-axis, as a function of time, along the x-axis. The graph 800 also shows current amplitude along the y-axis as a function of the time along the x-axis. The filament temperatures for three filament arrays (lines 807, 808, and 809) of a different average width are shown relative to the constant amplitude current signal (line 801) applied to the filament array 104. The graph 800 also includes a maximum temperature 810 for the filaments 200 (for example, a temperature at or above which the filaments 200 will fail).

As described herein, the filament array 104 may receive the generated current signal (represented by the line 801) from the control unit 102. The generated current signal may be received as a series or sequence of pulses. In some embodiments, during a first period 802, the current signal is received having a constant amplitude, shown by the straight portion of line 801 during the period 802. During the period 802, the current signal may not be "pulsed" but rather remains "on" constantly. Also during the period 802, in response to the current signal being "on", the filament temperatures, represented by lines 807, 808, and 809, increase relatively consistently. As described above, this may be due to the current signal passing through the filaments 200 and based on the resistance or resistivity of the material of the filament 200. In some embodiments, the slope or rate of temperature increase shown is dependent on the material of the filaments 200 in the filament array 104. As shown, as long as the current signal is applied to the filament array 104, the temperatures of the filaments 200 of the filament array 104 increase. As shown, the filaments 200 whose temperatures are represented by the lines 807, 808, and 809, may comprise different materials, which results in the different temperature values indicated by the lines 807, 808, and 809 in view of the constant current signal. Same applies if the dimensions of filaments vary, thus resulting in different resistance and heating rate.

In some embodiments, the period 802, during which the temperature of each of the filaments 200 of the filament array 104 increases substantially consistently, corresponds to a startup or warmup period. During the startup period, the filament array 104 prepares to create pores in the skin by heating the filaments 200 in the filament array 104 to or substantially to a desired temperature threshold at which pores will be created through the stratum corneum. As noted above, the temperature at which the lines 807, 808, and 809 peak is less than the maximum temperature 810. Accordingly, when the temperature of the filaments 200 reaches the desired temperature threshold (for example, as determined by the sensors 224 of the control unit 102), the control unit 102 may disable the current generator 220.

In some embodiments, during a second period 804, the current signal has a pulsed waveform. As shown in FIG. 8, the current signal alternates or pulses between being "on" and "off". Also during the period 804, in response to the current signal being the pulsed waveform, the filament temperatures, represented by lines 807, 808, and 809, fluctuate relative to the "on" or "off" state of the current signal line 801. As described above, this may be due to the current signal passing through the filaments 200 and based on the resistance or resistivity of the material of the filaments 200. In some embodiments, the slope or rate of temperature fluctuation shown is dependent on the material of the filaments 200 in the filament array 104. As shown, when the current signal is "on", the temperatures of the filaments 200 of the filament array 104 increase. When the current signal is "off", the temperatures of the filaments 200 decrease. The control of the current ON and OFF can be done by a constantly programmed sequence, via sensors (direct, measuring temperature or resistance, or indirect, measuring energy and power dispersed into filaments In some embodiments, the period 804, during which the temperature of each of the filaments 200 of the filament array 104 fluctuates in response to the current signal, corresponds to a maintenance period when the temperature of the filaments 200 is maintained at or near a target temperature. Accordingly, when the temperature of the filaments 200 falls below a threshold temperature (for example, as determined by the sensors 224 of the control unit 102), the control unit 102 may activate the current generator 220. The current generator 220 may be activated until the temperature of the filaments 200 reaches the desired temperature threshold, at which point the current generator 220 is disabled, as described above. Accordingly, during the maintenance period 804, the filament array 104 is maintained at or near the temperature to create pores in the skin by periodically heating/cooling the filaments 200 in the filament array 104 to or substantially to the desired temperature threshold. Thus, the activation/deactivation of the current generator 220 may be repeated.

In some embodiments, during a third period 806, the current signal is turned "off" and not received by the filament array 104. During the third period 806, the filaments 200 are allowed to cool off, as represented by the lines 807, 808, and 809 each dropping gradually to a relatively constant level at the end of the third period 806. In some embodiments, the third period 806 corresponds to a shutdown period where the temperature of the filaments 200 is allowed to cool down during a "cool-down" period of time. After the cool-down period another pulse train may be generated to bring the filaments to a desired temperature, this subsequent pulse train being the same or different as the previous one.

The control unit 102 may control the current generator 220 to generate the current signal that results in the filament temperatures of the lines 807, 808, and 809 in the graph 800. Accordingly, the current generator 220 may generate the current signal to increase the temperature of the filament array 104 to the ablation temperature (e.g., the 123° C.). The current generator 220 may then generate the current signal in pulses to maintain the temperature of the filament array 104 within a desired range and/or near the ablation temperature.

Figure 9:
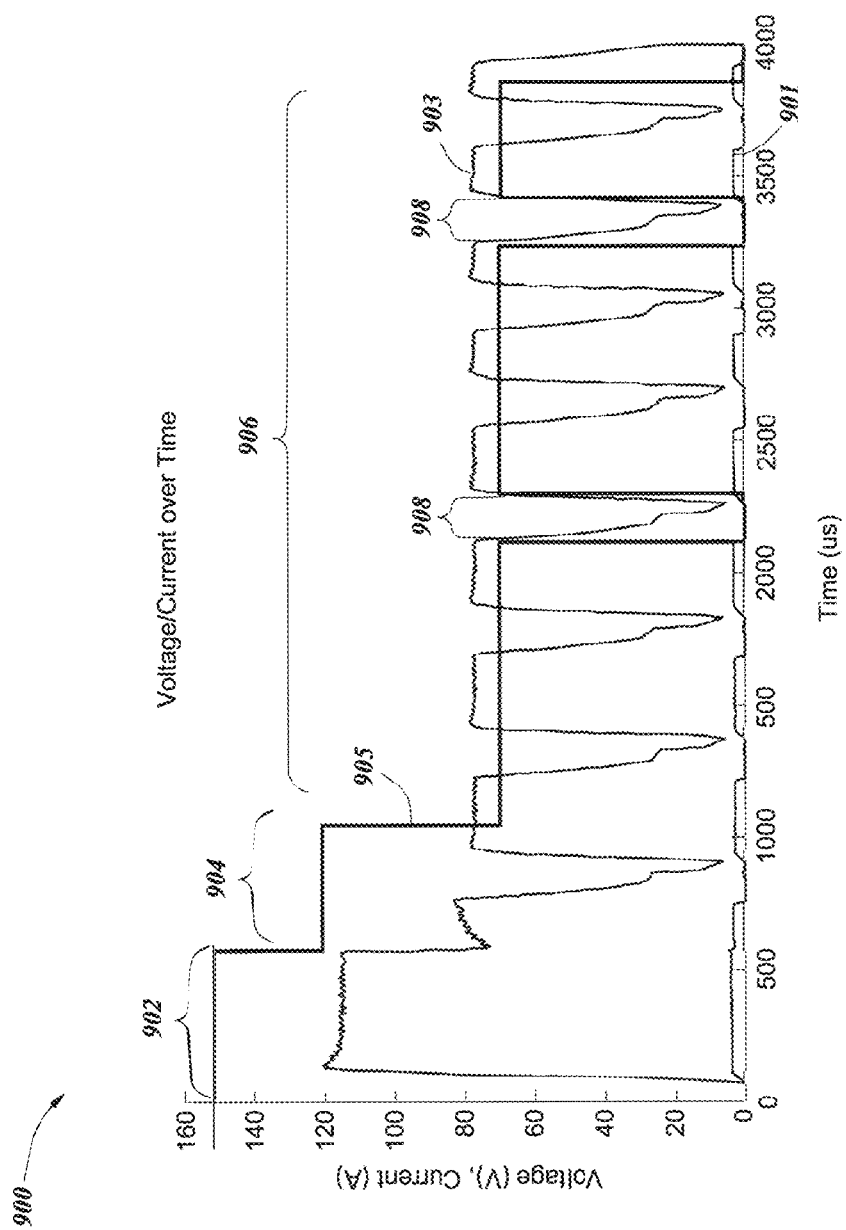
FIG. 9 is a graph illustrating current and voltage signals controlling the energy provided to a filament array over time relative to different phases of operation of a filament array, according to some embodiments.

FIG. 9 is a graph 900 showing current and voltage signals, lines 901 and 903, respectively, controlling the energy delivered to the filament array 104 over time, according to an exemplary embodiment. The graph 900 shows voltage and current along the y-axis as a function of time along the x-axis. The line 901 represents the current applied to the filament array 104 via the current signal. The line 903 represents the voltage of the filament array 104. The graph 900 also shows four phases or stages 902, 904, 906, and 908.

The line 901 shows that the current signal is applied in periodic pulses, with an initial pulse between approximately 100-7000 and subsequent pulses between approximately 800-1200 µs, 1300-1700 µs, 1800-2100 µs, 2300-2600 µs, 2700-2900 µs, 3000-3300 µs, 3400-3600 µs, and 3700-3900

μs. Each of the pulses includes a ramp-up, a plateau, and a ramp-down of the current signal. The line 903 shows that the voltage of the filament array 104 also pulses during the periodic pulses of the current signal. During the ramp-up and ramp-down periods of the current signal, the voltage is seen as also ramping-up and ramping-down at corresponding times. During the plateau periods of the current signal, the voltage is also seen to plateau.

The first stage 902 corresponds to a warm-up stage, during which the initial current pulse causes the filament array 104 to increase in temperature, as shown by the increase in the voltage during the first stage 902. The second stage 904 corresponds to a slow-down stage, during which the initial current pulse can be reduced in the amplitude to prevent fail open (blowing) of filaments. The third stage 906 corresponds to a maintenance stage, during which the subsequent pulses of the current signal (and the subsequent pulses of the voltage) occur. The third stage 906 may correspond to the maintenance stage during which the current signal is pulsed to maintain the temperature of the filament array 104 to enable the ablation. The pulses during the third stage 906 occur to ensure that the temperature of the filament array 104 does not exceed a failure temperature of the filaments 200 and does not fall below a temperature where ablation does not occur.

The third stage 906 also includes two stages 908. The two stages 908 correspond to temperature regulation periods. The current 901 and voltage 903 represent how the system looks in the case of pre-programmed maintenance pulsing (switching). This is good if all filaments (and filament arrays) are made with the exact dimensions. If some of them vary, due to manufacturing processes for example, this energy deliver can be too much or too little resulting in temperature spiraling out of control or slow cooling and insufficient energy delivery to create pores. Each switching form warm-up to slow-down to maintenance is controlled by a feedback loop. Once the temperature (or energy) threshold is reached the system goes into next state. Line 905 represents an implementation where the sensors 224 determined that current (or energy) provided to the filament array should be paused to prevent blowing of filaments and keeping the temperature constants. In other words, line 905 represents using a feedback loop that uses sensors 224 to control current provided to the filament array. In this case it was twice during the entire pulse train used in this example.

The control unit 102 may control the current generator 220 to generate the current signal shown in the graph 900. For example, as described above in relation to FIG. 8, the current generator may generate the current signal during the initial pulse and during the stage 902 to increase the temperature of the filament array 104 to or substantially to the ablation temperature (e.g., the 123° C.). The current generator 220 may then generate the current signal in pulses to maintain the temperature of the filament array 104 within a desired range and/or near the ablation temperature. These maintenance pulses may correspond to the pulses shown during the stage 906. During stage 904, the current generator 220 may remain off or reduce a current level of the initial pulse. Currents during those stages may or may not be the same amplitude.

In some embodiments, the control unit 102 of the thermal ablation system 100 is configured to control (for example, via the processor 204) the current generator 220 to generate the current signal having one or more pulses. The current generator 220 may be configured to control the pulse length of the current signal to be greater than or equal to a first pulse length (i.e., a maintenance pulse length) and less than a second pulse length (i.e., a warmup pulse length), the second pulse length being greater than the first pulse length.

In some embodiments, the control unit 102 of the thermal ablation system 100 is configured to control the supply current value to have a third current density (for example, the current density in the warmup stage) at a first time (during the warmup stage). The control unit 102 of the thermal ablation system 100 is configured to control the supply current value to have a fourth current density (for example, the current density in the maintenance stage) at a second time (during the maintenance stage), the third and fourth current densities being between or equal to the first current density (e.g., the line A current density) and the second current density (e.g., the line B current density). The fourth current density is less than the third current density, and the second time is later than the first time.

In some embodiments, the control unit 102, for example via the processor 204 and/or the current generator 220, may control the current signal and the current densities during the warmup and maintenance stages to enable ablation or poration of the stratum corneum to the epidermis while minimizing or reducing a likelihood of failure of the filaments 200.

In some embodiments, the control unit 102, for example via the processor 204 and/or the current generator 220, controls the pulse length of the current signal and a pulse period between consecutive pulses of the pulse signal together in combination to ablate or flash vaporize the skin surface while minimizing a likelihood of filament failure by melting.

Figure 10:
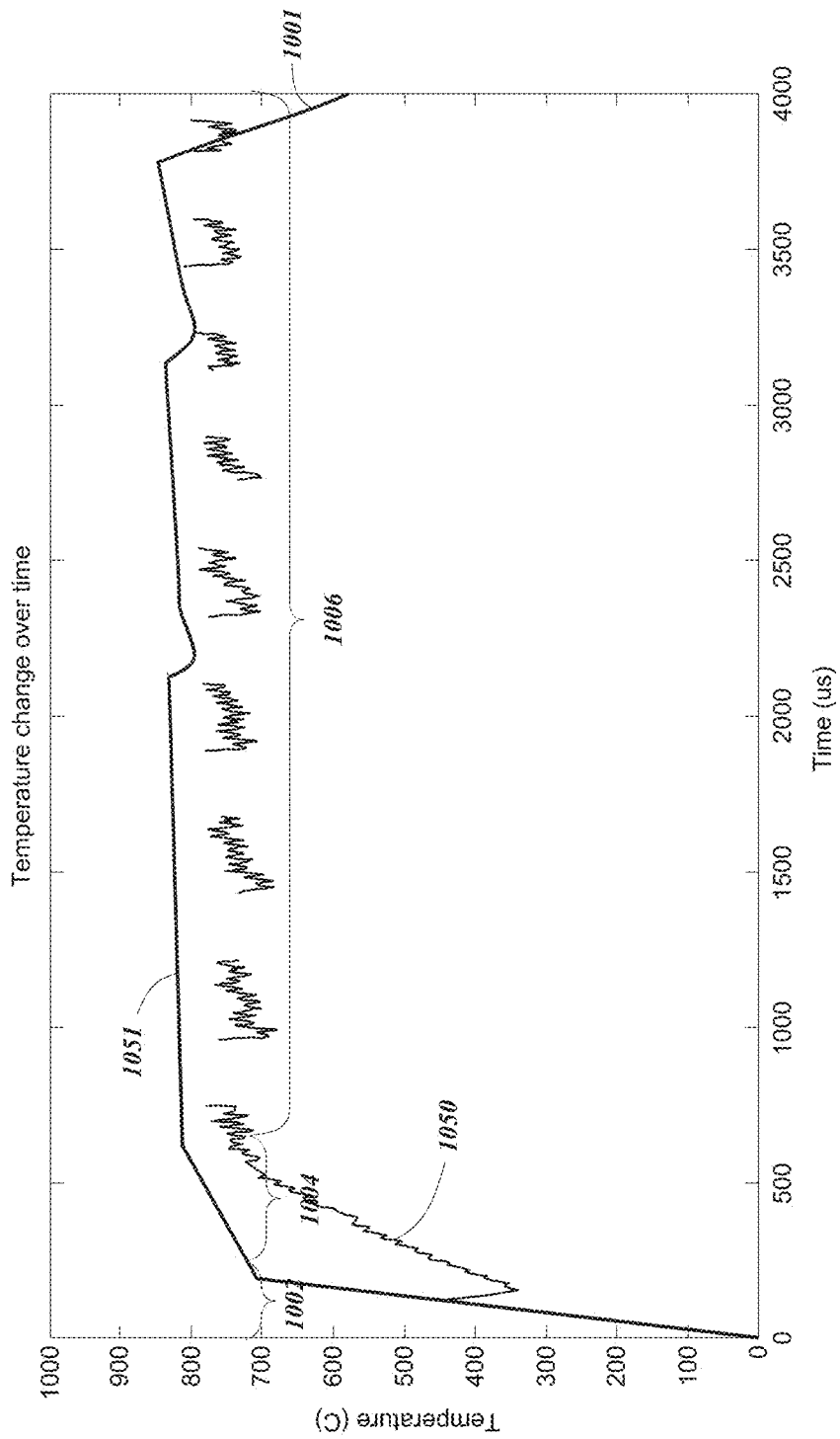
FIG. 10 is a graph of temperature (y-axis) as a function of time (x-axis) illustrating an operational temperature profile of a filament array, according to some embodiments.

FIG. 10 is a graph 1000 showing an operational temperature profile of the filament array 104 of FIG. 1A, according to an exemplary embodiment. A line 1001 represents the operational temperature profile shown, which generally tracks the temperature changes over time shown by line 1003. The graph 1000 also includes three phases 1002, 1004, and 1006.

Line 1050 is the voltage on the filament array which corresponds to the on/off stages of the current being switched on or off. Line 1051 is the calculated temperature. Phase 1002 is the warmup phase with highest current, 1004 slow-down with slightly lower current, thus slower temperature rise. Note that line 1050 in the 1004 segment is higher than in 1002 even though the current is lower. That is because the resistance of filament array 104 has risen due to increased temperature. The sharp drop in line 1050 between segments 1002 and 1004 points to the moment in time (and certain temperature) when current was dropped and voltage accordingly, but the temperature of filaments was relatively constant in that short moment of time. Once desired temperature was reached, the system entering the maintenance stage where we the voltage (line 1050) is constant (corresponds to constant temperate) and is switched (empty portions of the line).

Figure 11A:
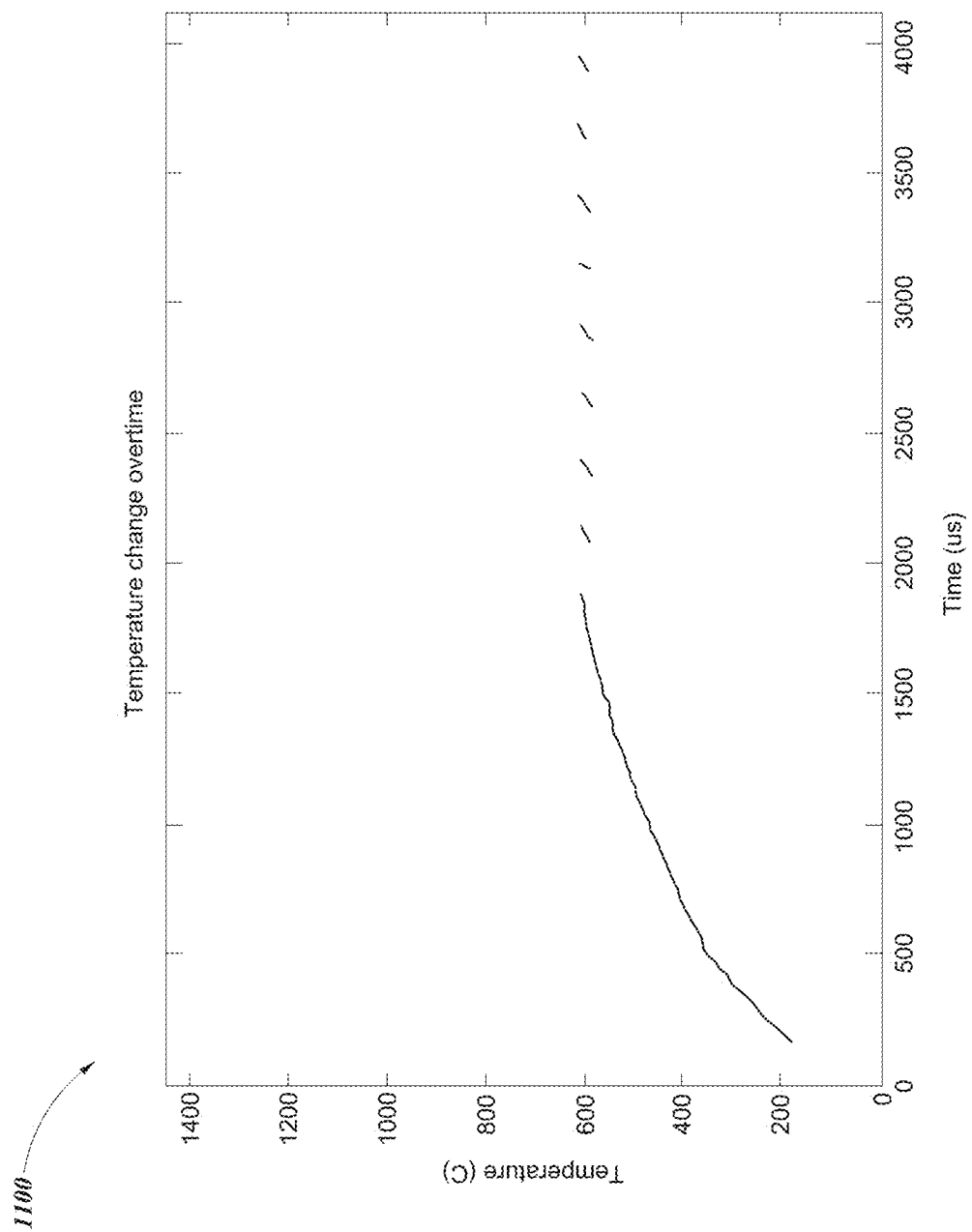
FIGS. 11A and 11B are graphs showing temperature curves of two different energy delivery profiles for the filament array of FIG. 1B, according to an exemplary embodiment.
Figure 11B:
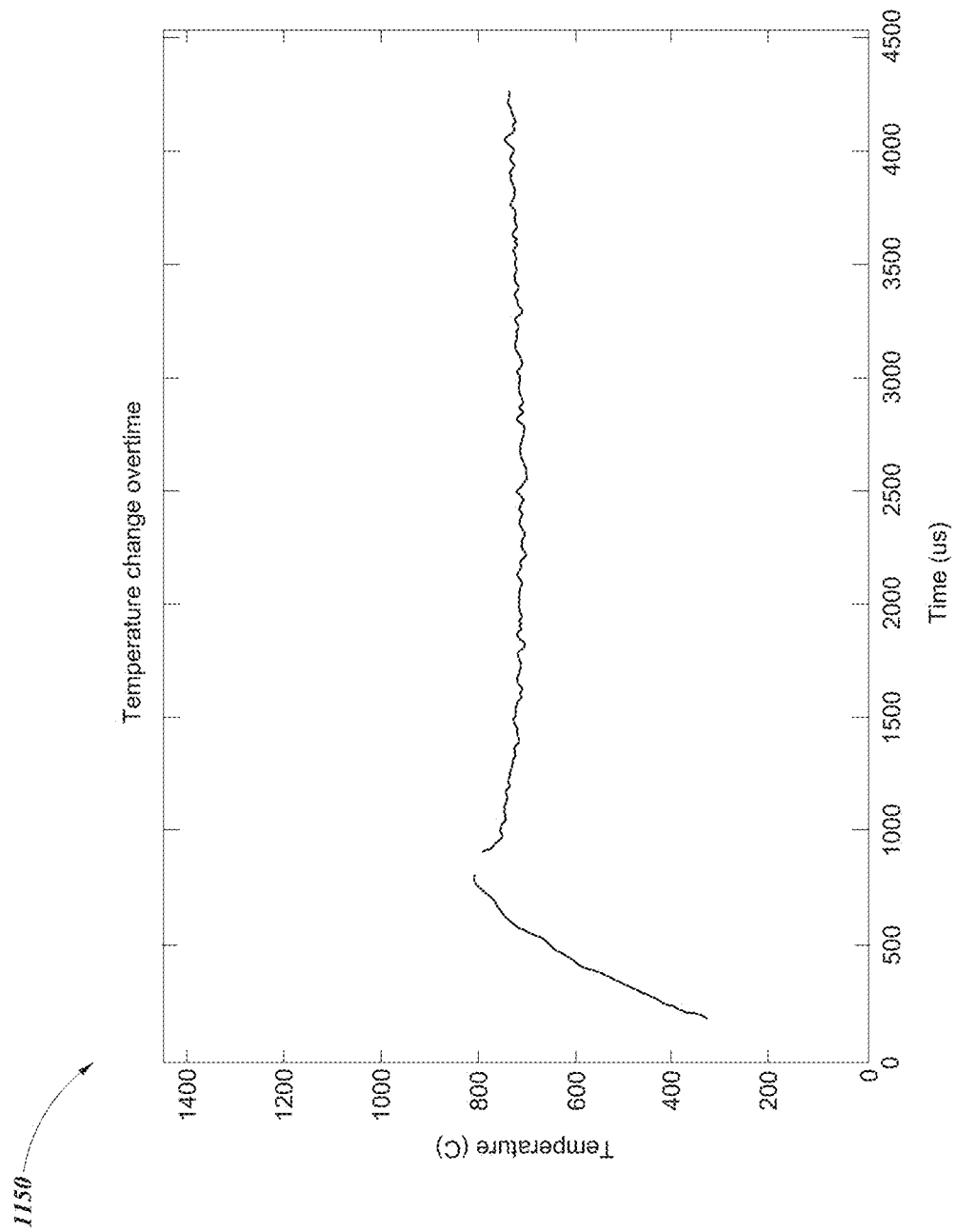

FIGS. 11A and 11B are graphs 1100 and 1150, respectively, showing temperature curves of two different energy delivery profiles for the filament array of FIG. 1B, according to an exemplary embodiment. The graph 1100 shows a low flux energy delivery profile. The low flux energy delivery profile includes a low current warming stage followed by a low temperature threshold stage. The low flux energy delivery profile may involve a low current through the filament array 104 that may result in pain due to longer pulses being used to convey the energy to the skin. Such longer pulses, even at lower currents, may result in charcoaling of the skin and closed pores. Additionally, the low flux energy delivery profile may utilize low temperature thresholds that are easier to control but result in even longer pulses because the same energy needs to be delivered in more chunks and lower quality (for example, less deep) pores.

The graph 1150 shows a high flux energy delivery profile. The high flux energy delivery profile includes a high current warming stage followed by a high temperature threshold stage. The high flux energy delivery profile may involve a high current through the filament array 104 that may result in a runaway effect and leads to failure of the filament array 104. However, the high flux energy delivery profile may be faster than the low flux energy delivery profile and produce better pores (for example, deeper pores) than the low flux energy delivery profile. Additionally, the high flux energy delivery profile may utilize high temperature thresholds that increase a risk of failure but result in shorter pulses and better pore performance as compared to the low flux energy delivery profile.

While keeping the power/total energy within the constraints described above, the delivery profile and pulse structure can also influence a quality and size of the pores. For example, in the profile of FIG. 11A, switching is used to ensure filament safety and temperature sinking. This switching may help the filaments cool slightly. If there is a state having a fast heating (warm-up period 1002) and high temperature threshold, with just a few switching moments, optimum energy flux is being provided to preserve the safety of the filaments and also to be on the fast side of the energy delivery to assure a more efficient process including reduced or eliminated pain response and better energy efficiency.

Having a high energy flux during a warmup stage of the filament array 104 to rapidly deliver the energy necessary to heat and ablate the stratum corneum and then lowering the energy flux to maintain a balance with evaporation of the epidermis layer may be beneficial. The lower energy flux can be achieved by modulated current levels of the current signal or modulated duty cycles based on the current signal, or a combination of the two. In some embodiments, a feedback system may, based on electrical measurements from, for example, the sensors 224 of the control unit 102, calculate a resistance of the filaments 200, which is proportional to the temperature of the filaments 200.

The feedback system may be implemented by one or more components of the control unit 102. The feedback system operates in the following fashion: an initial current (e.g., as generated by the current generator 220) is high in the rapid heating phase and is eventually reduced, triggered by the temperature of the filament reaching a set target, as determined by one of the sensors 224. The high initial current is followed by an intermediate phase that eases the filaments 200 (slows down heating rate) to the final temperature. Finally, the maintenance phase enables the current generator 220 and the control unit 102 to balance the energy between current pumped into the filaments 200 and energy used for epidermal evaporation (creation) of pores. Current fluxes are variable in these phases and can be set on a pulse by pulse basis by the current generator 220. Usually, the current fluxes are highest at the rapid heating phase and lowest during maintenance phase due to filament heating dynamics. Levels depend on the number of filaments, electrical topography of the array, and shape of the filaments 220. Triggering for pauses/changes in the current delivery can be by time, temperature of the filaments, individual or cumulative energy delivered, or combination of those.

The embodiments described herein assume that the contact between filaments 200 and skin is providing adequate transfer of the heat and that the contact is uniform. One of the ways to assure contact is to design & manufacture filaments 200 with a 3D structure that protrude outward towards the skin. The 3D structure of the filaments can facilitate better contact with the skin because the contact can occur with surfaces of the filaments 200 and not an entire surface of the filament array 104. Additionally, or alternatively, a vacuum may be introduced that pulls the skin into contact with or onto the filaments 200, as previously described. The vacuum may provide good uniform contact between the skin and the filaments 200. In some embodiments, for the porators with approximately 1 $cm^2$ contact active area from the filaments 200, a minimum vacuum needs to be about 5 mm Hg to create viable pores based on the energy ranges described above and where the pulse would not be too long nor endanger filaments 200 toward cascading failure.

In order to deliver consistent thermal ablation between a range of filament array probe designs, energy delivery from the probe to skin is closely measured. Embodiments of this invention aims to directly control the temperature of the filament array at the surface of the skin-probe contact sites, as well as dynamically regulate energy delivery.

Those of skill will recognize that the various illustrative logical blocks, modules, circuits, and algorithm steps described as follows, and in connection with the embodiments disclosed herein may be implemented as electronic hardware, software stored on a computer readable medium and executable by a hardware processor, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor reads information from, and write information to, the storage medium. In the alternative, the storage medium may be integral to the processor. The processor and the storage medium may reside in an ASIC.

While the above detailed description has shown, described, and pointed out novel features of the development as applied to various embodiments, it will be understood that various omissions, substitutions, and changes in the form and details of the device or process illustrated may be made by those skilled in the art without departing from the spirit of the development. As will be recognized, the present development may be embodied within a form that does not provide all of the features and benefits set forth herein, as some features may be used or practiced separately from others. All changes which come within the meaning and range of equivalency of the claims are to be embraced within their scope.

A person skilled in the art will recognize that each of these sub-systems may be inter-connected and controllably connected using a variety of techniques and hardware and that the present disclosure is not limited to any specific method of connection or connection hardware.

The technology is operational with numerous other general purpose or special purpose computing system environments or configurations. Examples of well-known computing systems, environments, and/or configurations that may be suitable for use with the invention include, but are not limited to, personal computers, server computers, hand-held or laptop devices, multiprocessor systems, microprocessor-based systems, a microcontroller or microcontroller based system, programmable consumer electronics, network PCs, minicomputers, mainframe computers, distributed computing environments that include any of the above systems or devices, and the like.

As used herein, instructions refer to computer-implemented steps for processing information in the system. Instructions may be implemented in software, firmware or hardware and include any type of programmed step undertaken by components of the system.

A microprocessor may be any conventional general purpose single- or multi-chip microprocessor such as a Pentium® processor, a Pentium® Pro processor, a 8051 processor, a MIPS® processor, a Power PC® processor, or an Alpha® processor. In addition, the microprocessor may be any conventional special purpose microprocessor such as a digital signal processor or a graphics processor. The microprocessor typically has conventional address lines, conventional data lines, and one or more conventional control lines.

The system may be used in connection with various operating systems such as Linux®, UNIX®, MacOS® or Microsoft Windows®, or custom made designated OS.

The system control may be written in any conventional programming language such as C, C++, BASIC, Pascal, .NET (e.g., C#), or Java, and ran under a conventional operating system. C, C++, BASIC, Pascal, Java, and FORTRAN are industry standard programming languages for which many commercial compilers may be used to create executable code. The system control may also be written using interpreted languages such as Perl, Python or Ruby. Other languages may also be used such as PHP, JavaScript, and the like.

The foregoing description details certain embodiments of the systems, devices, and methods disclosed herein. It will be appreciated, however, that no matter how detailed the foregoing appears in text, the systems, devices, and methods may be practiced in many ways. As is also stated above, it should be noted that the use of particular terminology when describing certain features or aspects of the invention should not be taken to imply that the terminology is being re-defined herein to be restricted to including any specific characteristics of the features or aspects of the technology with which that terminology is associated.

It will be appreciated by those skilled in the art that various modifications and changes may be made without departing from the scope of the described technology. Such modifications and changes are intended to fall within the scope of the embodiments. It will also be appreciated by those of skill in the art that parts included in one embodiment are interchangeable with other embodiments; one or more parts from a depicted embodiment may be included with other depicted embodiments in any combination. For example, any of the various components described herein and/or depicted in the Figures may be combined, interchanged or excluded from other embodiments.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present development. This development is susceptible to modifications in the methods and materials, as well as alterations in the fabrication methods and equipment. Such modifications will become apparent to those skilled in the art from a consideration of this disclosure or practice of the development disclosed herein. Consequently, it is not intended that this development be limited to the specific embodiments disclosed herein, but that it cover all modifications and alternatives coming within the true scope and spirit of the development as embodied in the attached claims.

As will be understood by those of skill in the art, in some embodiments, the processes set forth in the following material may be performed on a computer network. The computer network having a central server, the central server having a processor, data storage, such as databases and memories, and communications features to allow wired or wireless communication with various parts of the networks, including terminals and any other desired network access point or means.

What is claimed is:

1. An apparatus for delivering thermal energy to a biological membrane to cause the ablation of some portion of the biological membrane deep enough to cause a micropore, the apparatus comprising:
    a porator comprising an array of conductive filaments, wherein the porator is configured to generate thermal energy based on a current flowing through the array of conductive filaments, and provide the thermal energy to a biological membrane positioned adjacent to the porator; and a power supply circuit configured to provide the current to the porator in a plurality of pulses in a pulse train;

wherein the apparatus comprises a control circuit coupled to the power supply circuit, the control circuit configured to control one or more parameters of the plurality of pulses;

wherein the control circuit controls current values of the plurality of pulses so that control current values are greater than or equal to a first current density and less than or equal to a second current density, the second current density being greater than the first current density; and the control circuit controls a pulse train length of the plurality of pulses to be greater than or equal to a first pulse train length and less than a second pulse train length, the second pulse train length being greater than the first pulse train length.

2. The apparatus of claim 1, wherein the control circuit controls the one or more parameters to implement a porator thermal warmup process.

3. The apparatus of claim 2, wherein the control circuit controls the one or more parameters to implement a porator thermal slow-down process.

4. The apparatus of claim 2, wherein the control circuit controls the one or more parameters to implement a porator thermal and maintenance process.

5. The apparatus of claim 1, wherein the one or more parameters includes a current value representative of an amplitude of the current of at least one of the pulses.

6. The apparatus of claim 1, wherein the one or more parameters includes a frequency value representative of a frequency of at least a portion of the plurality of pulses.

7. The apparatus of claim 1, wherein the one or more parameters includes a pulse width value representative of a pulse width of at least one of the plurality of pulses.

8. The apparatus of claim 1, wherein the control circuit controls current values of the plurality of pulses so that control current values are greater than or equal to a first current density and less than or equal to a second current density, the second current density being greater than the first current density, and the control circuit controls a current value to have a third current density at a first time and a fourth current density at a second time, the third and fourth current densities being between or equal to the first and second current densities, the fourth current density being less than the third current density, and the second time being later than the first time.

9. The apparatus of claim 1, wherein the control circuit is further configured to control the supply current value to flash vaporize a portion of the membrane while minimizing likelihood of filament failure by melting.

10. The apparatus of claim 1, wherein the control circuit is further configured to determine a supply ratio of current to a cross-sectional area of the array of conductive filaments, and control the supply ratio between a first threshold and a second threshold that is greater than the first threshold.

11. The apparatus of claim 1, wherein the control circuit is further configured to control the pulse train length and a pulse period between consecutive pulses of the plurality of pulses together in combination to flash vaporize a portion of the membrane while minimizing likelihood of filament failure by melting.

12. The apparatus of claim 1, wherein the power supply circuit is further configured to:
monitor a temperature of the array of conductive filaments, and
control the temperature of the array of conductive filaments to prevent a filament failure from melting or failing into an open circuit state.

13. The apparatus of claim 12, wherein the power supply circuit is further configured to monitor a temperature of the array of conductive filaments at least in part based on a resistance of the array of conductive filaments.

14. The apparatus of claim 12, wherein the power supply circuit is further configured to monitor a temperature of the array of conductive filaments based at least in part on received sensed temperature information.

15. The apparatus of claim 14, further comprising at least one sensor configured to provide temperature information to the power supply circuit.

16. The apparatus of claim 1, wherein the power supply circuit is further configured to determine whether a pressure applied to the biological membrane surface by the array of conductive filaments is greater than or equal to a first pressure threshold.

17. The apparatus of claim 1, wherein the second pulse train length corresponds to a maximum pulse train length below which a user of the apparatus experiences painless micro-poration.

18. A method for delivering thermal energy to a biological membrane to cause an ablation of some portion of the membrane deep enough to cause a micropore, the method comprising applying the apparatus of claim 1 to the membrane, and controlling the plurality of pulses provided to the array of conducting filaments to heat the array of conducting filaments to cause the ablation of some portion of the membrane deep enough to create at least one micropore.

* * * * *